(12) United States Patent
Yamazaki et al.

(10) Patent No.: US 6,388,270 B1
(45) Date of Patent: May 14, 2002

(54) SEMICONDUCTOR DEVICE AND PROCESS FOR PRODUCING SAME

(75) Inventors: Shunpei Yamazaki, Tokyo; Toru Mitsuki, Kanagawa, both of (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 09/275,930

(22) Filed: Mar. 24, 1999

(30) Foreign Application Priority Data

Mar. 27, 1998 (JP) .......................................... 10-100641
Mar. 27, 1998 (JP) .......................................... 10-100643

(51) Int. Cl.[7] ........................ H01L 29/04; H01L 31/036
(52) U.S. Cl. .......................................... 257/59; 257/57
(58) Field of Search ..................................... 257/57, 59

(56) References Cited

U.S. PATENT DOCUMENTS 6,259,138 B1 * 7/2001 Ohtani et al.

FOREIGN PATENT DOCUMENTS

JP 11-284199 A * 10/1999
JP 2000-269139 A * 9/2000

* cited by examiner

Primary Examiner—Stephen D. Meier
(74) Attorney, Agent, or Firm—Cook, Alex, McFarron, Manzo, Cummings & Mehler, Ltd.

(57) ABSTRACT

To provide a semiconductor device utilizing a semiconductor film having a high crystallinity by a production process having a high mass productivity.

Upon crystallizing an amorphous silicon film 106, germanium is used as a catalyst element for accelerating the crystallization. A heat treatment is conducted in a condition in that a germanium film 107 is formed on the amorphous silicon film 106, and thus a polysilicon film 108 is obtained by the catalytic function of germanium. The polysilicon film 108 thus obtained has crystallinity that can be substantially regarded as a single crystal.

24 Claims, 11 Drawing Sheets

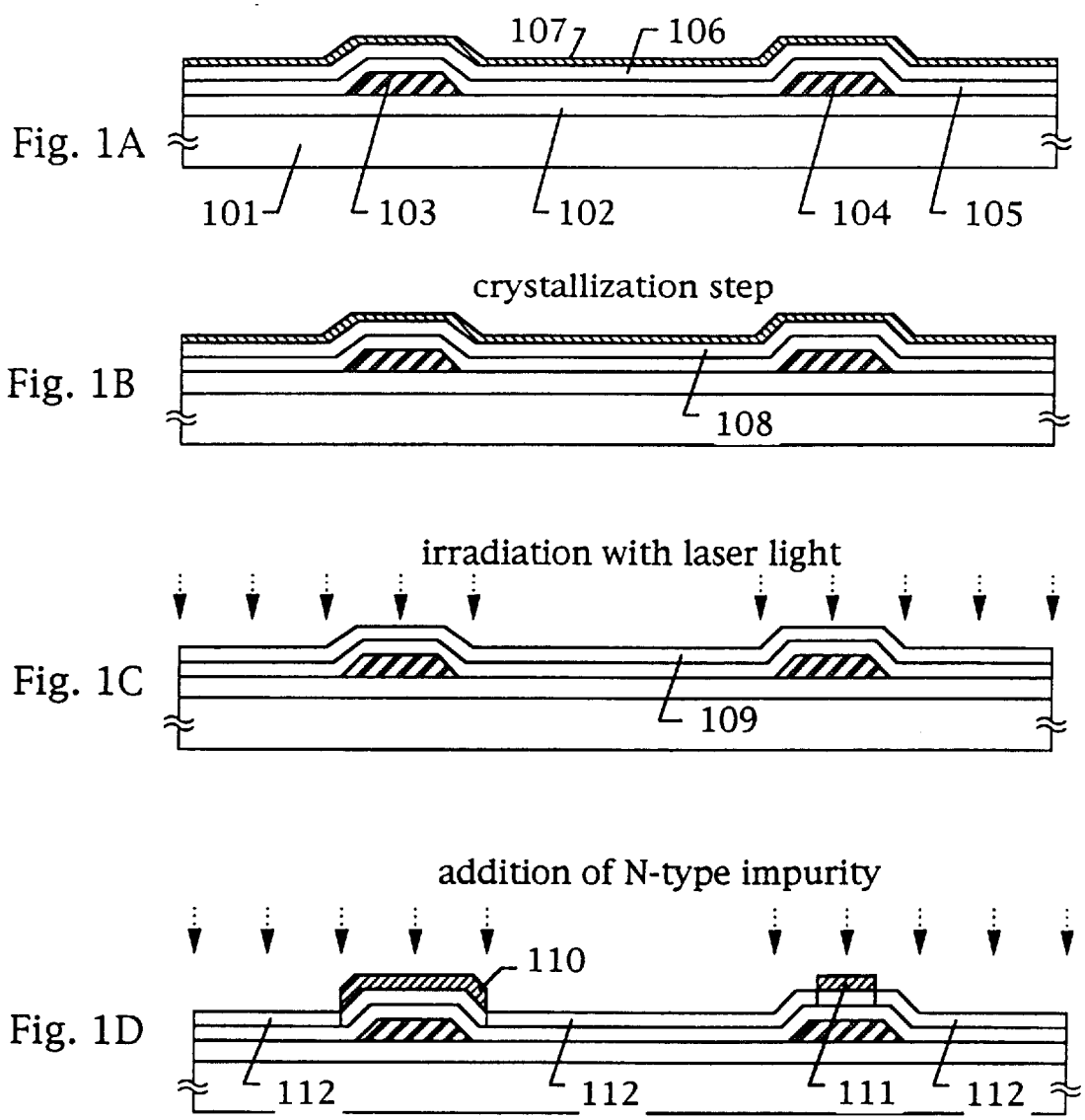

addition of N-type impurity addition of P-type impurity activation of impurity

NTFT    PTFT addition of N-type impurity addition of P-type impurity

NTFT        PTFT crystallization step fixing step of silicon interface addition of N-type impurity gettering step driver circuit          pixel matrix circuit gettering step driver circuit          pixel matrix circuit

SEMICONDUCTOR DEVICE AND PROCESS FOR PRODUCING SAME

BACKGROUND OF THE INVENTION

1. Field of the Invention

The present invention relates to a semiconductor device having a circuit comprising a thin film transistor (abbreviated as TFT hereinafter) formed by using a semiconductor thin film. In particular, it relates to a semiconductor device using a reverse stagger TFT.

The semiconductor device used herein means any device that can function utilizing semiconductor characteristics, and involves not only a single element, such as a TFT, but also a semiconductor circuit and an electro-optical apparatus, as well as an electronic apparatus carrying them as a part.

2. Description of Related Art

In recent years, a semiconductor device is receiving attention, in which a TFT is formed on a substrate by using a semiconductor thin film having crystallinity, and a circuit is formed with the TFT. As the semiconductor thin film, polycrystalline silicon (sometimes called polysilicon) is frequently used, and on the other hand, a compound semiconductor represented by $Si_xGe_{1-x}$ (0<x<1) is also studied.

While a TFT using a polysilicon film has been developed and is being subjected practical application, there is room for improvement in film quality and mass productivity, and further technical development is required. Under the circumstances, the inventors have proposed a technique described in JP-A-7-130652 and U.S. Pat. No. 5,643,826 (which is a counterpart of JP-A-7-130652), as a means for simultaneously solving the improvement in film quality of polysilicon and the improvement in mass productivity.

In the technique described in JP-A-7-130652, a catalyst element accelerating crystallization of silicon is added to an amorphous semiconductor film (a representative example thereof is amorphous silicon), and the crystallization is carried out by utilizing the function of the catalyst element. As a result, the temperature and time required for the crystallization be decreased, and the throughput is considerably improved. Furthermore, it has been confirmed that the resulting polysilicon has a remarkably high crystallinity, and the electric characteristics of the TFT are also considerably improved.

However, since nickel (Ni), which is the most effective as the 10 catalyst element, is a metallic element, there is a possibility in that nickel adversely affects the TFT characteristics when it remains in the polysilicon. Accordingly, the inventors have considered that removal of nickel is necessary after completion of the crystallization, and have developed a technique conducting gettering of the catalyst element. Such a method is described in JP-A-9-312260 or a copending application Ser. No. 08/785,489 filed on Jan. 17, 1997, which is a counterpart application of JP-A-9-312260.

The gist of the techniques described in these publications resides in the use of a metallic element, such as nickel, as a catalyst element for accelerating the crystallization, and thus the catalyst element is not necessarily present after the formation of polysilicon.

SUMMARY OF THE INVENTION

The invention has been developed in view of the problems described above, and an object of the invention is to provide a technique for forming a semiconductor film having high crystallinity by a production method excellent in mass productivity.

Another object of the invention is to improve an yield and a production cost of the semiconductor device by constituting a circuit with a TFT using the semiconductor film.

In the invention, germanium (Ge), which is a semiconductor, is used as a catalyst element accelerating the crystallization of silicon, so as to provide a process in that gettering is not necessary. Because germanium has the properties extremely close to silicon, it is present in silicon in conditions of good compatibility. That is, germanium has an advantage in that it does not adversely affect the TFT characteristics even if it is not removed after used as a catalyst element.

The invention is based on the technique in that germanium is added to an amorphous silicon film, and the amorphous silicon is crystallized by utilizing the catalytic action of germanium. According to the technique, the crystallization at a low temperature, decrease of the processing time, and shortening of the process are simultaneously realized.

Because germanium is present in silicon in conditions of good compatibility, the crystallinity is extremely high in comparison to the cases using other catalyst elements. Germanium continuously changes the band gap of silicon depending on its addition amount, and thus an active layer having a narrower band gap than polysilicon can be formed. By utilizing such an active layer in a TFT, a higher mobility (field effect mobility) than a TFT using an active layer of polysilicon can be realized.

BRIEF DESCRIPTION OF THE DRAWINGS

FIGS. 1A to 1D are cross sectional views showing the production process of the thin film transistor.

DESCRIPTION OF THE PREFERRED EMBODIMENTS

Figure 2A:
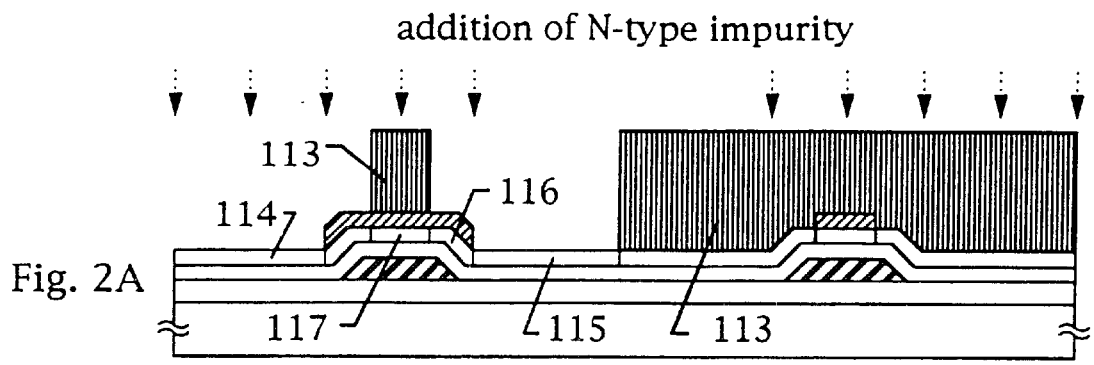
FIGS. 2A to 2D are cross sectional views showing the production process of the thin film transistor.

The invention having the constitution described above will be described in more detail with reference to the following examples.

EXAMPLE 1

A production process of a TFT using the invention will be described with reference to FIGS. 1A to 1D and 2A to 2D.

In this example, the case of producing a CMOS circuit formed by complementarily combining an NTFT (N-channel type TFT) and a PTFT (P-channel type TFT) is exemplified.

An underlayer 102 comprising a silicon oxide film is provided on a glass substrate 101, and gate electrodes 103 and 104 are formed thereon. Gate wiring, not shown in the figures, connected to the gate electrodes is also formed.

In this example, a layer having a three-layer structure of tantalum nitride/tantalum/tantalum nitride, as a conductive film constituting the gate electrodes 103 and 104. The film thickness thereof is controlled within the range of from 200 to 400 nm. A gate insulating film 105 comprising a silicon oxide nitride represented by $SiO_xN_y$ having a thickness of 150 nm is further formed thereon.

An amorphous silicon film 106 having a thickness of 30 nm as an amorphous semiconductor film is formed thereon. Other than the amorphous silicon film, a compound semiconductor, such as a silicon germanium compound represented by $Si_xGe_{1-x}$ (0<x<1), may be used.

A germanium film 107 is formed on the amorphous silicon film 106 by the sputtering method. The film formation is conducted by using a germanium target under the conditions in that the ultimate pressure is $4 \times 10^{-4}$ Pa or less, the sputtering gas is argon, the film formation temperature is room temperature, the film forming pressure is 0.4 Pa, and the DC current on film formation is 0.4 A.

The film formation of the germanium film 107 can also be conducted by the reduced pressure thermal CVD method and the plasma CVD method. Because germane ($GeH_4$) is a vary decomposable gas, it is easily decomposed at a low temperature of about 450° C. to form a germanium film.

Thus, the state shown in FIG. 1A is obtained. The amorphous silicon film 106 is then crystallized by conducting a heat treatment at 600° C. for 8 hours, to change into a polysilicon film 108 as a crystalline semiconductor film. When the temperature exceeds 600° C., it is not preferred since the spontaneous generation of nuclei in the amorphous silicon is increased, which are present with the crystals having germanium nuclei, to deteriorate the crystallinity. (FIG. 1B)

The crystallization step may be carried out by using any of furnace annealing, lamp annealing and laser annealing. In this example, the furnace annealing is employed with the uniformity of the resulting film being regarded.

The atmosphere of the heat treatment is preferably an inert atmosphere or a hydrogen atmosphere. When oxygen is present, the germanium film is easily oxidized to become an inactive germanium oxide film. Attention should be paid because crystallization failure occurs due to deterioration of the catalytic action in such a case.

The resulting polysilicon film 108 has excellent crystallinity even though it is formed at a relatively low temperature of about 600° C. The polysilicon film produced under the conditions of this example is observed by a TEM (transmission electron microscope), and a result is shown in the micrograph of FIGS. 11A and 11B.

Figure 11A:
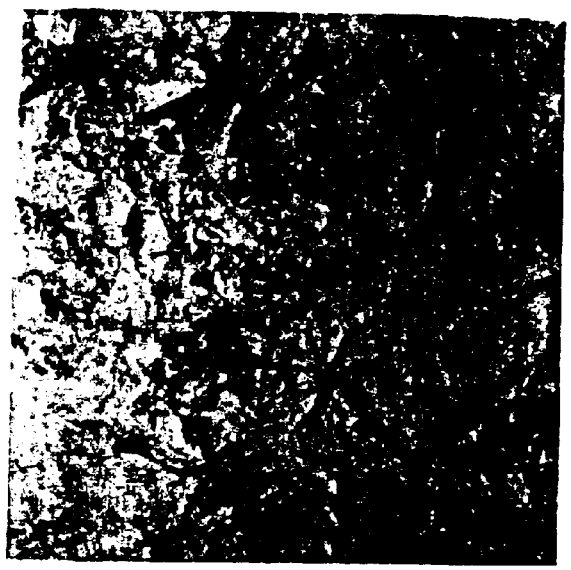
FIGS. 11A and 11B are TEM micrographs obtained by observing the surface of the polysilicon film according to the invention.
Figure 11B:
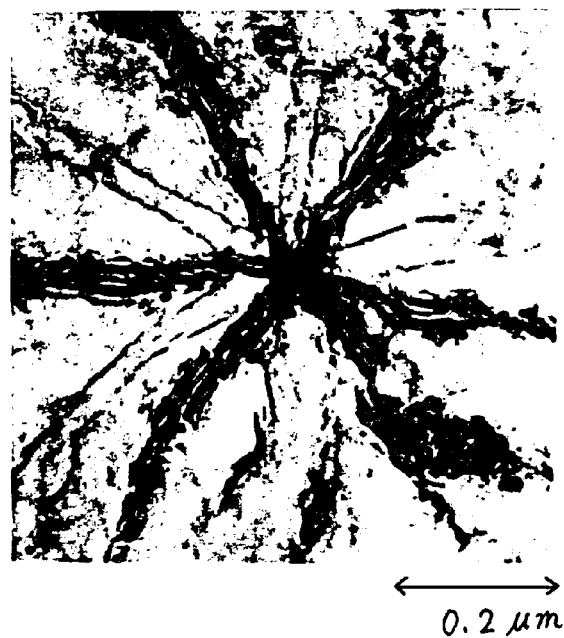

FIG. 11A is a micrograph of the surface of the film with a magnification of 25,000. Black patterns observed on the micrographs do not correspond to real matters, but can be seen due to the difference in contrast. However, the patterns have a characteristic pattern in that the black portions begin from the point and extend to the periphery (Ref. FIG. 11B), and it is considered that the pattern is characteristic in the polysilicon film produced according to the process of this example.

In the polysilicon film of the invention having the appearance described above, germanium is present in a concentration increasing toward the vicinity of the primary surface. In a typical case, germanium is often present only in the vicinity of the primary surface (region within about 10 nm from the surface of the polysilicon opposite to the underlayer). In such a case, it was confirmed by an SIMS (secondary ion mass spectrum) that germanium is present in the vicinity of the primary surface in a concentration of from $1 \times 10^{14}$ to $1 \times 10^{22}$ atoms/cm$^3$ (typically from $1 \times 10^{18}$ to $1 \times 10^{19}$ atoms/cm$^3$).

When the concentration of germanium becomes from $1 \times 10^{20}$ to $1 \times 10^{22}$ atoms/cm$^3$, it is considered that silicon and germanium form an alloy to become a silicon germanium layer represented by $Si_xGe_{1-x}$ (0<x<1). In this example, it is considered that germanium is present only in the vicinity of the primary surface of the polysilicon film, and there is a case where only the vicinity of the primary surface becomes a silicon germanium layer.

It should be noted that the region of the depth of about 10 nm or deeper from the surface is a polysilicon film, in which germanium is not present. Therefore, the polysilicon layer and the silicon germanium layer form a layered structure, which is different from the structure of a TFT utilizing only a silicon germanium layer as an active layer.

When the concentration of germanium present in the vicinity of the primary surface of the polysilicon film is from $1 \times 10^{14}$ to $1 \times 10^{20}$ atom/cm$^3$, the whole of the active layer becomes a polysilicon layer. In such a germanium concentration, the alloy is not formed, and it is considered that the formation of the silicon germanium layer does not occur.

It has been confirmed by XRD (X-ray diffractiometry) that the polysilicon film shown in FIGS. 11A and 11B is oriented substantially in the {111} orientation. That is, the primary orientation plane of the polysilicon film 108 shown in FIG. 1B is substantially the {111} plane.

As a result of measurement of the polysilicon film shown in FIGS. 11A and 11B by the electron beam diffractiometry, a electron beam diffraction pattern that is substantially the same as that obtained from a single crystal silicon of {111} orientation is obtained. This means that the polysilicon film shown in FIGS. 11A and 11B has a crystalline structure that can be substantially regarded as a single crystal.

The polysilicon film 108 has a crystallinity that can be substantially regarded as a single crystal through the crystallization using the catalytic action of germanium as described above.

After obtaining the polysilicon film 108, a germanium film remaining on the polysilicon film 108 is removed by a sulfuric acid-hydrogen peroxide aqueous solution ($H_2SO_4$/$H_2O_2$=1/1), and the polysilicon film 108 is irradiated with excimer laser light to further improve the crystallinity. (FIG. 1C)

This step is conducted to complete the crystallization by irradiation of the laser light when an amorphous component remains in the crystallization step of FIG. 1B. At the same time, faults in the crystalline particles are also decreased by the momentary heat treatment. The step of irradiation of laser light may be omitted if it is not necessary.

After obtaining a polysilicon film 109 that has been completely crystallized, a silicon oxide film having a thickness of 120 nm is formed thereon, and spacer insulating layers 110 and 111 are formed by patterning the silicon oxide film. After forming the spacer insulating layers 110 and 111, an impurity element endowing n-type semiconductivity (n-type impurity, phosphorus in this example) is added to form an n-type impurity region 112. (FIG. 1D)

In this example, the addition of the impurity endowing n-type semiconductivity is conducted according to the plasma doping method using phosphine (PH$_3$) as a doping gas. The acceleration voltage is 10 keV, and the addition is conducted to make the dose amount of $5\times10^{14}$ atoms/cm$^2$. The doping conditions are not limited to this example and can be changed according to necessity.

After thus obtaining the state shown in FIG. 1D, a resist mask 113 is selectively provided, and then the second addition step of the n-type impurity is conducted. In the region to be an NTFT, the resist mask 113 is provided above the region to become a channel region. In the region to be a PTFT, the resist mask 113 is provided to prevent the addition of the n-type impurity. (FIG. 2A)

In this step, the acceleration voltage is 90 keV, which is a relatively higher value than the preceding step, and the dose amount is $3\times10^{13}$ atoms/cm$^2$. The spacer insulating layers 110 and 111 do not function as a mask under such a acceleration voltage, and therefore the impurity ion is added to the edge part of the spacer insulating layers (region not covered by the resist mask 113).

According to this step, a source region 114, a drain region 115, a pair of LDD regions (low concentration impurity regions) 116 and a channel forming region 117 of the NTFT are fixed. Because the second doping step is the step of forming the LDD region, a suitable doping amount as the LDD region should be appropriately determined by the practician.

Figure 2B:
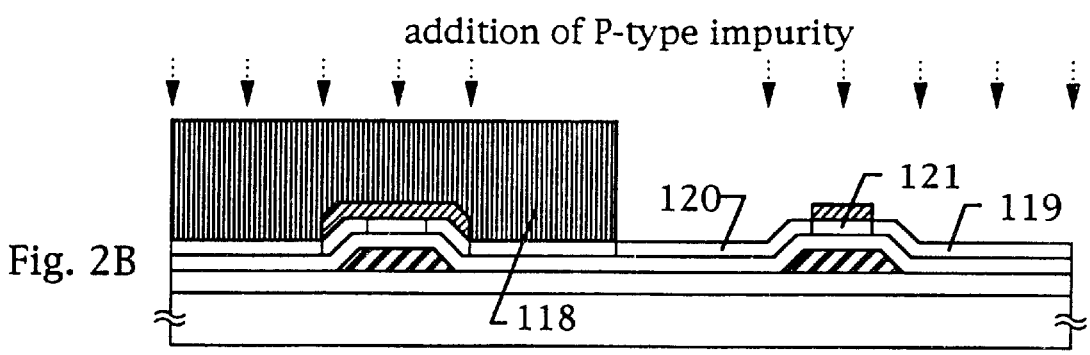

After removing the resist mask 113, the region to be the NTFT is completely covered with a resist mask 118, and an impurity endowing p-type semiconductivity (p-type impurity, boron in this example) is added. In this example, diborane (B$_2$H$_6$) is used as a doping gas, the acceleration voltage is 10 keV, and the dose amount is $1.3\times10^{15}$ atoms/cm$^2$. (FIG. 2B)

In this step, the spacer insulating layer 111 perfectly functions as a mask, and therefor no impurity is added to the region covered by the spacer insulating layer 111, so that the spacer insulating layer 111 fixes a source region 119, a drain region 120 and a channel forming region 121. While phosphorous has been added to the region to be the PTFT in the step of FIG. 1D, the region is converted to p-type in this step.

After completing the step of addition of the impurity ion to form the source region, the drain region and the LDD region, the resist mask 118 is removed, and then a polysilicon film is patterned to form island-form silicon layers (active layers) 122 and 123.

Figure 2C:
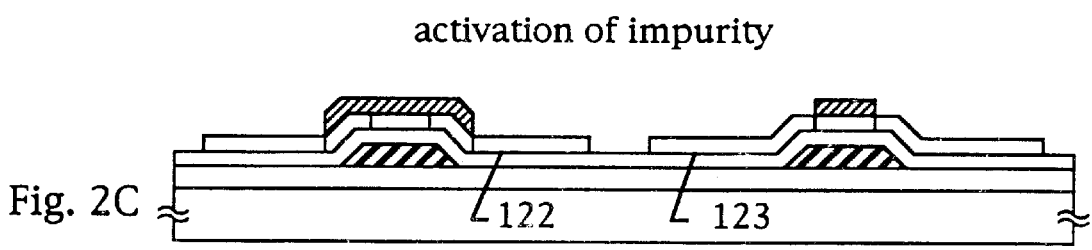

Thereafter, an activation step of the impurities is conducted. In this example, the activation step is carried out by irradiation of excimer laser light, but may be conducted by using furnace annealing or lamp annealing. In addition, these may be used in combination. (FIG. 2C)

The spacer insulating layers 110 and 111 may be removed before the activation step of the impurities. By removing the spacer insulating layers 110 and 111, the efficiency of the activation by irradiation of laser light can be considerably improved. However, since the channel forming region is exposed by removing the spacer insulating layer, the spacer insulating layer should remain as possible.

A interlayer insulating film 124 comprising a silicon oxide film is then formed, and contact holes are formed to form source wiring 125 and 126, and drain wiring 127. At this time, contact holes (not shown in the figures) should be formed to make the gate wiring connected to the gate electrode in electrically contact with the source wiring (or the drain wiring).

Figure 2D:
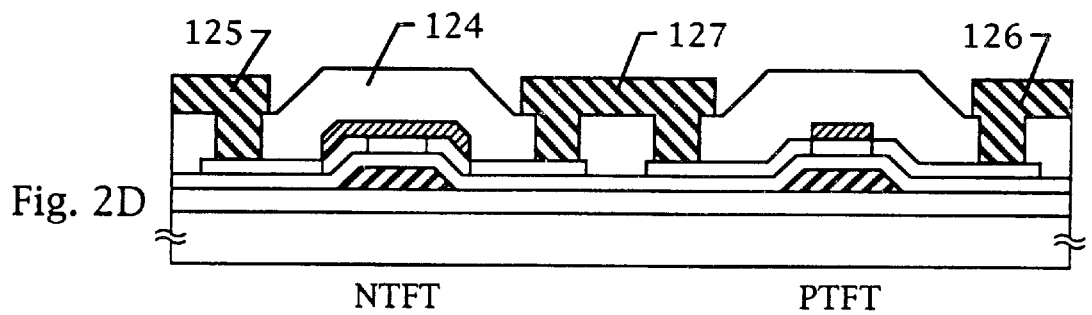

Finally, a heat treatment in a hydrogen atmosphere at 350° C. for about 2 hours is conducted for the whole device to terminate unpaired bonds in the films (particularly in the channel forming region) with hydrogen. A CMOS circuit shown in FIG. 2D is completed through the process described above.

One of the characteristic features of the TFT produced in the process of this example is that in the polysilicon film to be an active layer, the concentration of germanium is higher in the region closer to the primary surface. This is because the crystallization occurs at the primary surface by contact with germanium. In the typical case, germanium is often present only in the vicinity of the primary surface. The concentration of germanium in this case is about from $1\times10^{14}$ to $1\times10^{22}$ atoms/cm$^3$.

Because the channel forming region does not suffer any process of disturbing the crystallinity in the step subsequent the formation of the active layer, its primary orientation plane is substantially the {111} plane, and it maintains the crystalline structure that can be substantially considered as a single crystal.

In the invention, a circuit is constituted with the reverse stagger TFT produced by the process described above. The production process in this example is only one example for carrying out the invention, and the invention is not construed as being limited to this example.

While not applied in this example, additional steps, such as control of the threshold voltage by conducting channel doping on the NTFT and PTFT, can be appropriately conducted by the practician.

In the reverse stagger TFT produced according to the process of this example, the mobility (field effect mobility), as one of the representative electric characteristics, is from 100 to 200 cm$^2$/Vs in the NTFT and from 80 to 150 cm$^2$/Vs in the PTFT, and the S value (subthreshold coefficient) is from 0.2 to 0.4 V/decade in both the NTFT and PTFT. These values are equivalent or superior to those of TFTs produced by the conventional technique.

Furthermore, since removal of the catalyst element (germanium) utilized in the crystallization of the amorphous silicon is not necessary in the invention, the number of steps can be greatly simplified in comparison to the conventional technique (technique using a metallic element as a catalyst element).

The important feature of the invention resides in that the amorphous silicon film is crystallized by utilizing germanium as the catalyst element, and this constitution is not limited by the structure of the TFT produced. Therefore, the invention can be applied to a top-gate TFT such as a planar TFT and a direct stagger TFT.

In the case where the invention is applied to the top-gate TFT, the channel forming region formed in the vicinity of the primary surface is formed in the silicon germanium layer in the active layer having the structure of this example. Therefore, because the channel region in which a carrier migrates is the silicon germanium layer, the carrier mobility is increased. While it has been reported that the silicon germanium layer has a problem of increasing a leakage current, the laminate structure of this example is effective to suppress the off current and the leakage current because the region deeper than the silicon germanium layer is the polysilicon layer.

When the concentration of germanium present in the vicinity of the primary surface of the polysilicon layer is from $1\times10^{14}$ to $1\times10^{20}$ atoms/cm$^3$, the whole of the active layer becomes a polysilicon film. It is considered that the alloy is not formed with such a concentration of germanium, and the silicon germanium layer is not formed.

EXAMPLE 2

A production process of a TFT using the invention will be described with reference to FIGS. 4A to 4D and 2A to 2D. In this example, the case of producing a CMOS circuit formed by complementarily combining an NTFT (N-channel type TFT) and a PFTF (P-channel type TFT) as the basic constitution of the circuit is exemplified.

This example is a mere example of the cases where a TFT is produced by utilizing the invention, and therefore, the conditions and the numeral values are not limited to those in this example.

An underlayer 1102 comprising a silicon oxide film is provided on a quartz substrate 1101, and gate electrodes 1103 and 1104 are formed thereon. Gate wiring, not shown in the figures, connected to the gate electrodes is also formed.

The reason why the quartz substrate is used in this example is that a substrate having high heat resistance is necessary since a high temperature treatment at a temperature exceeding 700° C. is conducted in the subsequent heat oxidation step.

In this example, a layer having a three-layer structure of tantalum nitride/tantalum/tantalum nitride is employed, as a conductive film constituting the gate electrodes 1103 and 1104. The film thickness thereof is controlled within the range of from 200 to 400 nm. In this example, since the high temperature treatment is conducted in the subsequent step, a conductive film having high heat resistance should be used. Other than such a layer, chromium, titanium and tungsten may be used.

A gate insulating film 1105 comprising a silicon oxide nitride represented by $SiO_xN_y$ having a thickness of 150 nm is further formed thereon. Silicon oxide, silicon nitride and a laminated structure thereof may also be used.

An amorphous silicon film 1106 having a thickness of 30 nm as an amorphous semiconductor film is formed thereon. Other than the amorphous silicon film, a compound semiconductor, such as a silicon germanium compound represented by $Si_xGe_{1-x}$ (0<x<1), may be used.

A germanium film 1107 is formed on the amorphous silicon film 1106 by the sputtering method. The film formation is conducted by using a germanium target under the conditions in that the ultimate pressure is $4\times10^{-4}$ Pa or less, the sputtering gas is argon (Ar), the film formation temperature is room temperature, the film forming pressure is 0.4 Pa, and the DC current on film formation is 0.4 A.

The film formation of the germanium film 1107 can also be conducted by the reduced pressure thermal CVD method and the plasma CVD method. Because germane ($GeH_4$) is a vary decomposable gas, it is easily decomposed at a low temperature of about 450° C. to form a germanium film.

Figure 4A:
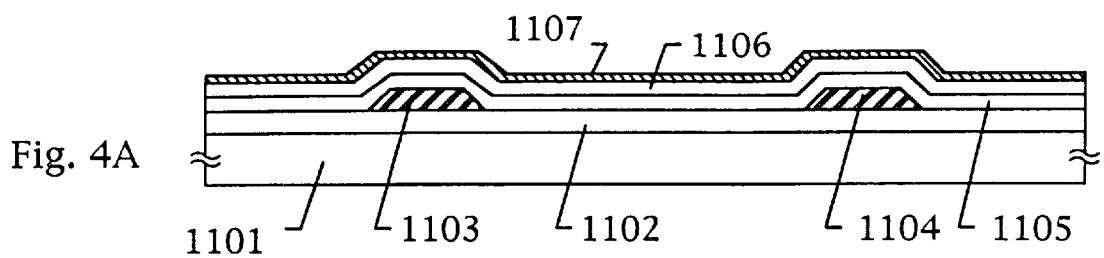
FIGS. 4A to 4D are cross sectional views showing the production process of the thin film transistor.
Figure 4B:
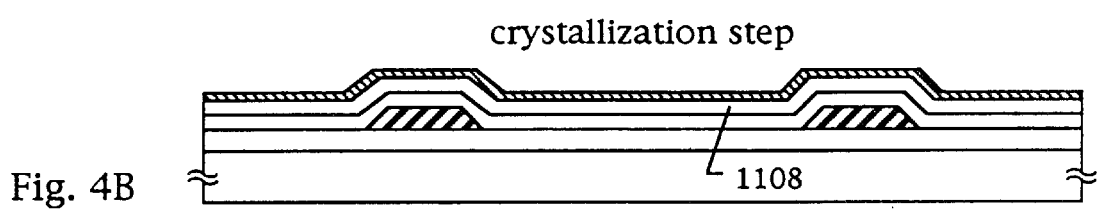

Thus, the state shown in FIG. 4A is obtained. The amorphous silicon film 1106 is then crystallized by conducting a heat treatment at 600° C. for 8 hours, to change into a polysilicon film 1108 as a crystalline semiconductor film. When the temperature exceeds 600° C., it is not preferred since the spontaneous generation of nuclei in the amorphous silicon is increased, which are present with the crystals having germanium nuclei, to deteriorate the crystallinity. (FIG. 4B)

The crystallization step may be carried out by using any of furnace annealing, lamp annealing and laser annealing. In this example, the furnace annealing is employed with the uniformity of the resulting film being regarded.

The atmosphere of the heat treatment is preferably an inert atmosphere or a hydrogen atmosphere. When oxygen is present, the germanium film is easily oxidized to become an inactive germanium oxide film. Attention should be paid because crystallization failure occurs due to deterioration of the catalytic action in such a case.

Figure 4C:
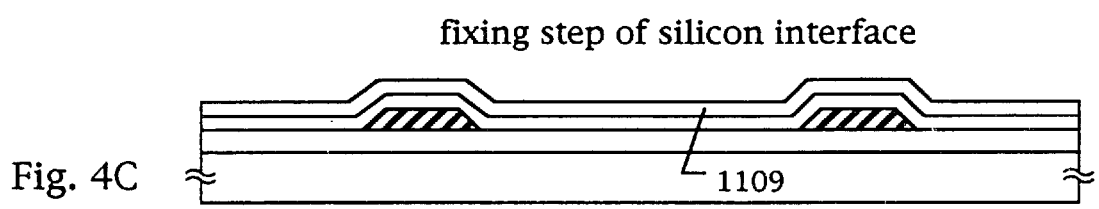

After obtaining the polysilicon film 1109, a germanium film remaining on the polysilicon film 1109 is removed by a sulfuric acid-hydrogen peroxide aqueous solution ($H_2SO_4$/$H_2O_2$=1/1). Thereafter, a heat treatment at 900° C. for 30 minutes is conducted in an oxygen atmosphere. (FIG. 4C)

In the invention, the heat treatment at such a high temperature (at least a temperature higher than the heat treatment temperature in the crystallization step) is important. By conducting this step, the trap level present in the boundaries of the crystalline graoms and the faults (such as stacking faults) in the crystalline particles can be greatly reduced.

The inventors consider the following model for the effect described above. There is a difference in heat expansion coefficient by nearly 10 times between the polysilicon film and the underlying quartz (silicon oxide). Therefore, at the time when the amorphous silicon film is converted into the polysilicon film, a large stress is generated on cooling the polysilicon film.

Figure 12A:
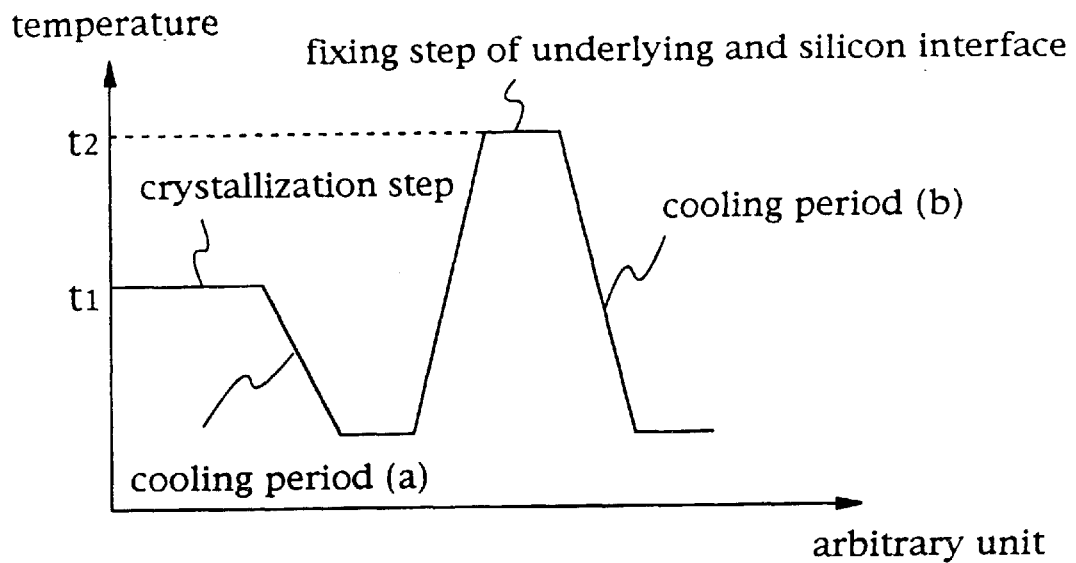
FIGS. 12A to 12C are diagrams showing the outline of the fixing step.

This phenomenon will be described with reference to FIGS. 12A to 12C. FIG. 12A shows the thermal history of the polysilicon film after the crystallization step. The polysilicon film crystallized at a temperature $t_1$ is cooled to room temperature over the cooling period (a).

Figure 12B:
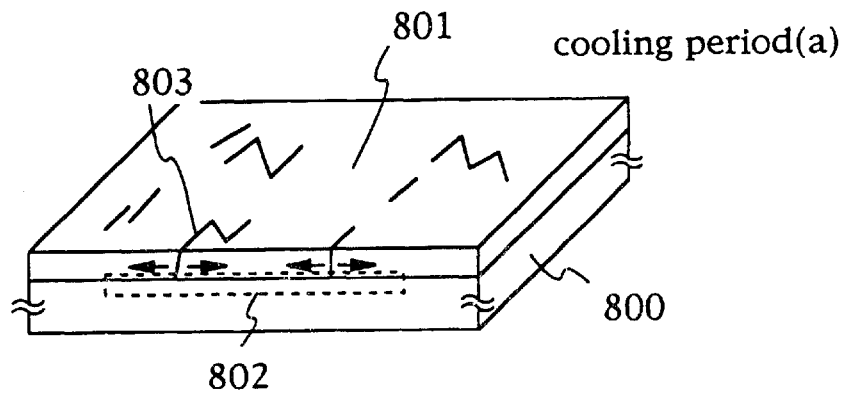
Figure 12C:
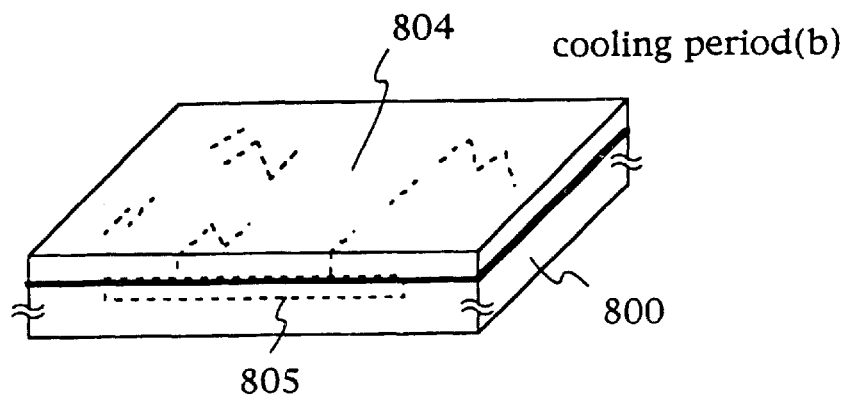

FIG. 12B shows the polysilicon film in the cooling period (a), in which numeral 800 denotes the quartz substrate, and 801 denotes the polysilicon film. In this period, the adhesion at the interface 802 between the polysilicon film 801 and the quartz substrate 800 is not so high, and thus it is considered that a large number of faults in the crystalline particles are formed.

Accordingly, the polysilicon film 801 under tension due to the difference in heat expansion coefficient is very movable on the quartz substrate 800, and it is considered that faults 803, such as stacking faults and dislocation, are easily formed by force, such as a tensile stress.

The polysilicon film thus obtained corresponds to the polysilicon film 108 shown in FIG. 4B. Thereafter, the heat treatment at a temperature $t_2$ as shown in FIG. 12A, and the faults in the crystalline particles (intra-particle faults) are substantially disappeared. It is considered that this is because lattice interstitial type silicon atoms present among the lattice move by the heat treatment to compensate the faults.

Because such lattice penetrating silicon atoms are formed in a large amount by the heat oxidation step, the faults are more effectively removed by conducting the heat treatment at a temperature higher than the crystallization temperature in an oxidation atmosphere.

The polysilicon film, from which the intra-particle faults have been removed, is then cooled to room temperature over the cooling period (b). What is different in this period from the cooling period (a) is that the interface 805 between the quartz substrate 800 and the polysilicon film 804 after annealing is in a state of extremely high adhesion. (FIG. 12C)

Because the polysilicon film 804 is completely fixed on the quartz substrate 800 due to such high adhesion, no fault is formed even when a stress is applied to the polysilicon film in the cooling period of the polysilicon film. That is, regeneration of faults can be prevented.

By conducting the heat treatment at a temperature exceeding the temperature of the crystallization step after completing the crystallization, the interface between the polysilicon film and the underlying is firmly fixed to remove the intra-particle faults and, at the same time, to prevent regeneration of faults. The inventors call this heat treatment step as a fixing step of a silicon interface.

While the process in which the temperature is lowered to room temperature after the crystallization step is exemplified in FIG. 12A, the fixing step can be conducted by increasing the temperature immediately after completing the crystallization. The polysilicon film having the same crystallinity can be obtained through such a process.

The polysilicon film 1109 thus obtained has a characteristic feature in that the number of faults in the crystalline particles is extremely smaller than the polysilicon film 1108 obtained simply by crystallization. The difference in number of faults reflected to the difference in spin density of electron spin resonance (ESR) analysis.

It has been found at the present time that the spin density of the polysilicon film 1109 is at least $5 \times 10^{17}$ spins/cm$^3$ or less (preferably $3 \times 10^{17}$ spins/cm$^3$ or less). However, these measured values are close to the detection limit of the measuring apparatus currently available, and it is expected that the actual spin density is lower than these.

By using germanium as the catalyst element, abnormal oxidation of the polysilicon film is prevented in the step shown in FIG. 4C. According to the inventors, in the case where nickel is used as the catalyst for crystallization, nickel silicide may be intensively oxidized to abnormally grow. This can be prevented by conducting the heat oxidation without directly contacting the silicon with the oxidative atmosphere, but such brings about increase in number of steps.

In the invention, on the other hand, because germanium having high compatibility with silicon is used instead of nickel, such a localized abnormal oxidation does not occur, and the polysilicon film after the crystallization can be directly subjected to the heat treatment.

While the heat treatment at 900° C. for 30 minutes is employed in this example, the temperature is typically from 800 to 1,050° C. (preferably from 850 to 900° C.), and the characteristic feature resides in that the heat treatment is conducted at such a high temperature. Because it is considered that the heat oxidation mechanism is greatly contributed to the decrease of the intra-particle faults, the conditions are preferably those in which heat oxidation easily occur.

Therefore, the lower limit of the temperature of the heat treatment is preferably 800° C. taking the throughput into consideration, and the upper limit is preferably 1,050° C. taking the heat resistance of the substrate (quartz in this example) into consideration. Because the melting point of germanium is from 930 to 940° C., the upper limit is more preferably 900° C.

The atmosphere of the heat treatment is preferably an oxidative atmosphere, but may be an inert atmosphere. In the case where an oxidative atmosphere is employed, one of a dry oxygen ($O_2$) atmosphere, a wet oxygen ($O_2+H_2$) atmosphere and an atmosphere containing a halogen element (such as $O_2+HCl$) can be employed.

In particular, when the heat treatment is conducted in an atmosphere containing a halogen, excess germanium present among the lattice of polysilicon is removed in the form of volatile $GeCl_4$ due to the gettering effect of the halogen atom. Therefore, it is an effective means to obtain a polysilicon film having a small lattice distortion.

Furthermore, when the heat treatment is conducted in an oxidative atmosphere at a temperature of from 800 to 1,050° C., the polysilicon film itself becomes thin due to the formation of a heat oxidation film (not shown in the figures). Upon practicing the invention, it is preferred to design in such a manner that the film thickness of the amorphous silicon on the film formation is determined with considering the decrease in film thickness due to the heat oxidation step, and the film thickness finally utilized as an active layer of a TFT, from 5 to 50 nm (preferably from 15 to 45 nm), is obtained. When the film thickness becomes 5 nm or less, the formation of a normal source/drain contact becomes difficult, and when it exceeds 50 nm, the effect of the thinning of the film becomes weak.

The polysilicon film of this example obtained through the production process described above has an extremely high crystallinity, and thus is an optimum semiconductor film as an active layer of a thin film transistor. The crystalline structure thereof is extremely characteristic.

When the polysilicon film obtained by the process described above is observed by a TEM (transmission electron microscope), a characteristic pattern radially extending from one point. It is considered that the pattern is characteristic in the polysilicon film that is crystallized by using germanium.

It has been confirmed that the polysilicon film 1109 is substantially in the {111} orientation according to an XRD (X-ray diffractiometry) analysis. Furthermore, as a result of a measurement of the polysilicon film 1109 by the electron diffractiometry, the substantially same electron diffraction pattern as a single crystal silicon of the {111} orientation has been obtained. This means that the polysilicon film 1109 has a crystalline structure that can be substantially regarded as a single crystal.

The crystalline structure of the polysilicon film of the invention described in detail here remains without change until completion of the TFT. That is, the active layer of the TFT produced according to the production process of this example has a primary orientation plane of substantially the {111} plane, contains substantially no fault in the crystalline particles, and has a crystalline structure that can be substantially regarded as a single crystal.

Germanium is present in the polysilicon film of this example. It has been confirmed that germanium is distributed in a concentration of from $1 \times 10^{14}$ to $1 \times 10^{22}$ atoms/cm$^3$ according to SIMS (secondary ion mass spectrum). The distribution of germanium has a tendency in that it becomes higher with being closer to the primary surface of the polysilicon film (the surface of the polysilicon film opposite to the underlying).

The region in that germanium is present in a concentration of about from $1 \times 10^{14}$ to $1 \times 10^{22}$ atoms/cm$^3$ is only the vicinity of the primary surface (the region within the depth of about 10 nm from the primary surface). Under such a concentration of germanium, there is a case where an alloy of silicon and germanium is formed, and it becomes a silicon germanium layer represented by $Si_xGe_{1-x}$ (0<x<1). In this example, such a silicon germanium layer may be formed only in the vicinity of the primary surface of the polysilicon film.

However, in the region deeper than the depth of about 10 nm from the primary surface, germanium is present in a concentration of from $1\times10^{14}$ to $1\times10^{20}$ atoms/cm$^3$ at most, and a silicon germanium layer is not formed. That is, the polysilicon layer and the silicon germanium layer form a laminated structure, which is clearly different from a TFT having only a silicon germanium layer as an active layer.

When the concentration of germanium present in the vicinity of the primary surface is from $1\times10^{14}$ to $1\times10^{20}$ atoms/cm$^3$, the whole of the active layer becomes a polysilicon layer. In such a germanium concentration, the alloy is not formed, and it is considered that the formation of the silicon germanium layer does not occur.

After obtaining a polysilicon film 1109 that has been completely crystallized, a silicon oxide film having a thickness of 120 nm is formed thereon, and spacer insulating layers 1110 and 1111 are formed by patterning the silicon oxide film. After forming the spacer insulating layers 1110 and 1111, an impurity element endowing n-type semiconductivity (n-type impurity, phosphorus in this example) is added to form an n-type impurity region 1112. (FIG. 4D)

In this example, the addition of the impurity endowing n-type semiconductivity is conducted according to the plasma doping method using phosphine (PH$_3$) as a doping gas. The acceleration voltage is 10 keV, and the addition is conducted to make the dose amount of $5\times10^{14}$ atoms/cm$^2$. The doping conditions are not limited to this example and can be changed according to necessity.

Figure 4D:
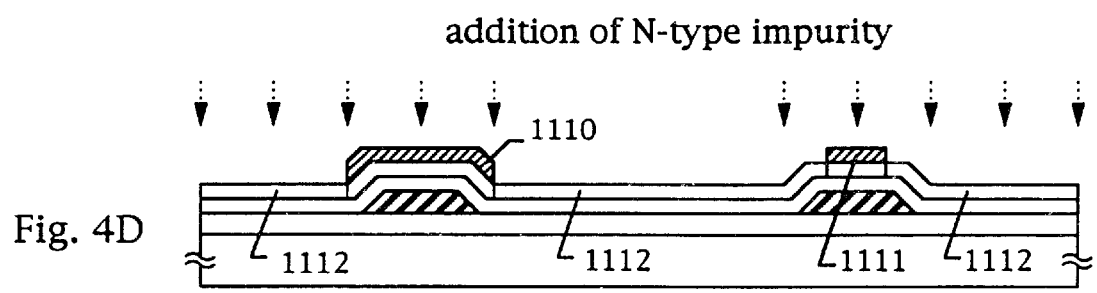

After thus obtaining the state shown in FIG. 4D, a resist mask 113 is selectively provided, and then the second addition step of the n-type impurity is conducted. In the region to be an NTFT, the resist mask 113 is provided above the region, at which a channel forming region is to be provided. In the region to be a PTFT, the resist mask 113 is provided to prevent the addition of the n-type impurity. (FIG. 2A)

In this step, the acceleration voltage is 90 keV, which is a relatively higher value than the preceding step, and the dose amount is $3\times10^{13}$ atoms/cm$^2$. The spacer insulating layers 110 and 111 do not function as a mask under such a acceleration voltage, and therefore the impurity ion is added to the edge part of the spacer insulating layers (region not covered by the resist mask 113).

According to this step, a source region 114, a drain region 115, a pair of LDD regions (low concentration impurity regions) 116 and a channel forming region 117 of the NTFT are fixed. Because the second doping step is the step of forming the LDD region, a suitable doping amount as the LDD region should be appropriately determined by the practician.

After removing the resist mask 113, the region to be the NTFT is completely covered with a resist mask 118, and an impurity endowing p-type semiconductivity (p-type impurity, boron in this example) is added. In this example, diborane (B$_2$H$_6$) is used as a doping gas, the acceleration voltage is 10 keV, and the dose amount is $1.3\times10^{15}$ atoms/cm$^2$. (FIG. 2B)

In this step, the spacer insulating layer 111 perfectly functions as a mask, and therefor no impurity is added to the region covered by the spacer insulating layer 111, so that the spacer insulating layer 111 fixes a source region 119, a drain region 120 and a channel forming region 121. While phosphorous has been added to the region to be the PTFT in the step of FIG. 4D, the region is converted to p-type in this step.

After completing the step of addition of the impurity ion to form the source region, the drain region and the LDD region, the resist mask 118 is removed, and then a polysilicon film is patterned to form island-form silicon layers (active layers) 122 and 123.

Thereafter, an activation step of the impurities is conducted. In this example, the activation step is carried out by irradiation of excimer laser light, but may be conducted by using furnace annealing or lamp annealing. In addition, these may be used in combination. (FIG. 2C)

The spacer insulating layers 110 and 111 may be removed before the activation step of the impurities. By removing the spacer insulating layers 110 and 111, the efficiency of the activation by irradiation of laser light can be considerably improved. However, since the channel forming region is exposed by removing the spacer insulating layer, the spacer insulating layer should remain as possible.

A interlayer insulating film 124 comprising a silicon oxide film is then formed, and contact holes are formed to form source wiring 125 and 126, and drain wiring 127. At this time, contact holes (not shown in the figures) should be formed to make the gate wiring connected to the gate electrode in electrically contact with the source wiring (or the drain wiring).

Finally, a heat treatment in a hydrogen atmosphere at 350° C. for about 2 hours is conducted for the whole device to terminate unpaired bonds in the films (particularly in the channel forming region) with hydrogen. A CMOS circuit shown in FIG. 2D is completed through the process described above.

One of the characteristic features of the TFT produced in the process of this example is that in the polysilicon film to be an active layer, the concentration of germanium is higher in the region closer to the primary surface. This is because the crystallization occurs at the primary surface by contact with germanium. In the typical case, germanium is often present only in the vicinity of the primary surface. The concentration of germanium in this case is about from $1\times10^{14}$ to $1\times10^{22}$ atoms/cm$^3$.

Because the channel forming region does not suffer any process of disturbing the crystallinity in the step subsequent the formation of the active layer, its primary orientation plane is substantially the {111} plane, and it maintains the crystalline structure that can be substantially considered as a single crystal and the character that the spin density of the polysilicon film is $5\times10^{17}$ spins/cm$^3$.

In the invention, a circuit is constituted with the reverse stagger TFT produced by the process described above. The production process in this example is only one example for carrying out the invention, and the invention is not construed as being limited to this example.

While not applied in this example, additional steps, such as control of the threshold voltage by conducting channel doping on the NTFT and PTFT, can be appropriately conducted by the practician.

In the reverse stagger TFT produced according to the process of this example, the mobility (field effect mobility), as one of the representative electric characteristics, is from 200 to 350 cm$^2$/Vs in the NTFT and from 150 to 250 cm$^2$/Vs in the PTFT, and the S value (subthreshold coefficient) is from 70 to 200 mV/decade in both the NTFT and PTFT.

The important feature of the invention resides in that the amorphous silicon film is crystallized by utilizing germanium as the catalyst element, and this constitution is not limited by the structure of the TFT produced. Therefore, the invention can be applied to a top-gate TFT such as a planar TFT and a direct stagger TFT.

In the case where the invention is applied to the top-gate TFT, the channel forming region formed in the vicinity of the primary surface is formed in the silicon germanium layer in the active layer having the structure of this example. Therefore, because the channel region in which a carrier migrates is the silicon germanium layer, the carrier mobility is increased. While it has been reported that the silicon germanium layer has a problem of increasing a leakage current, the laminate structure of this example is effective to suppress the off current and the leakage current because the region deeper than the silicon germanium layer is the polysilicon layer.

When the concentration of germanium present in the vicinity of the primary surface of the polysilicon layer is from $1 \times 10^{14}$ to $1 \times 10^{20}$ atoms/cm$^3$, the whole of the active layer becomes a polysilicon film. It is considered that the alloy is not formed with such a concentration of germanium, and the silicon germanium layer is not formed.

EXAMPLE 3

In this example, a reverse stagger TFT produced by a process different from those of Examples 1 and 2 is described with reference to FIGS. 3A to 3E.

Figure 3A:
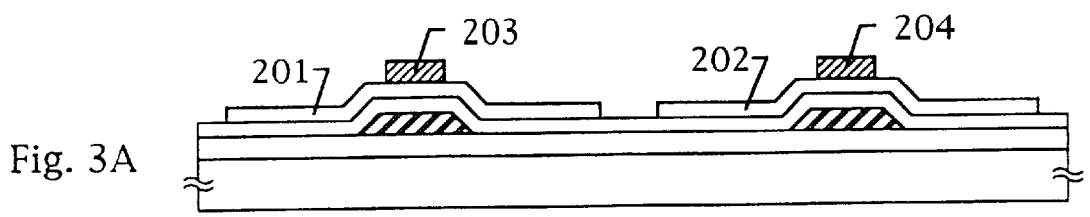
FIGS. 3A to 3E are cross sectional views showing the production process of the thin film transistor.

The steps until FIG. 1C according to Example 1 or the steps until FIG. 4C according to Example 2 are completed. Active layers 201 and 202 are then formed by patterning a polysilicon film. After completing the active layers 201 and 202, spacer insulating layers 203 and 204 comprising a silicon oxide film are formed. (FIG. 3A)

Figure 3B:
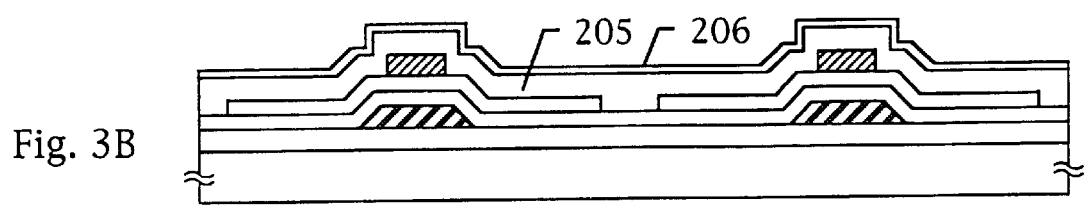

An amorphous silicon film 205 is formed by the plasma CVD process or the reduced pressure thermal CVD process to a thickness of 100 nm, and a microcrystalline silicon film 206 is formed thereon to a thickness of 50 nm. (FIG. 3B)

The film forming conditions of the amorphous silicon film 205 are that 100 sccm of SiH$_4$ and 300 sccm of H$_2$ are used as film forming gases, the film forming pressure is 0.75 torr, and the applied electric power is 20 W. The film forming conditions of the microcrystalline silicon film 206 are that 5 sccm of SiH$_4$ and 500 sccm of H$_2$ are used as film forming gases, the film forming pressure is 0.75 torr, and the applied electric power is 300 W.

Figure 3C:
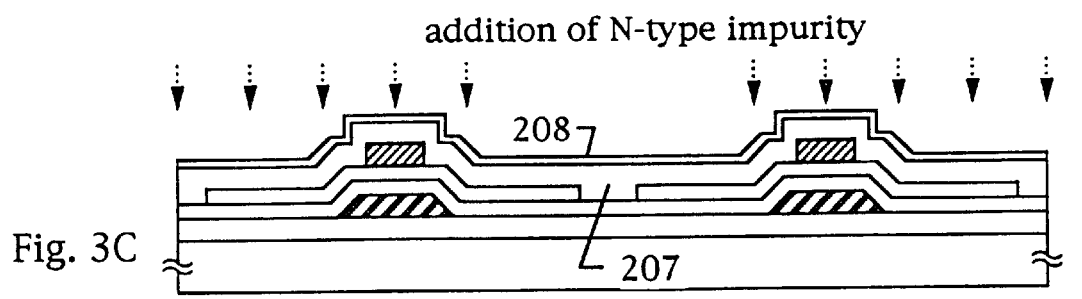

Addition of an impurity element endowing n-type semiconductivity (n-type impurity, phosphorus in this example) is conducted to the amorphous silicon film 205 and the microcrystalline silicon film 206, to obtain an n-type amorphous silicon film 207 and an n-type microcrystalline silicon film 208. (FIG. 3C)

The addition conditions of phosphorous are an accelerated voltage of 10 keV and a dose amount of $5 \times 10^{14}$ atoms/cm$^2$. The n-type semiconductor layer comprising a laminated structure of the amorphous silicon film 207 and the microcrystalline silicon film 208 functions as an electrode for withdrawing a carrier from the active layer, and thus it has an electric conductivity corresponding to the function. Therefore, the conditions are not necessarily limited to the numeral values employed in this example.

The reason why the microcrystalline silicon film is provided at the uppermost layer is that ohmic contact with a wiring layer comprising a conductive film formed later can be easily ensured. While the amorphous silicon film and the conductive film are difficult to provide good ohmic contact, ohmic contact of a level that does not cause any problem can be obtained between the microcrystalline silicon film and the conductive film.

Figure 3D:
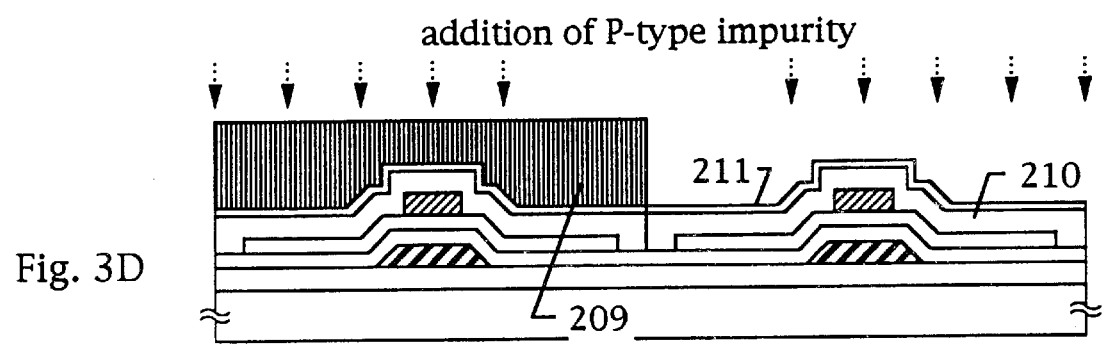

The region to be an NTFT is covered with a resist mask 209, and an impurity element endowing p-type conductivity (boron in this example) is added. According to this step, the region to be a PTFT is converted from the n-type semiconductor layer previously formed to form a p-type semiconductor layer comprising a p-type amorphous silicon film 210 and a p-type microcrystalline silicon film 211. (FIG. 3D)

The addition conditions of boron are an acceleration voltage of 10 keV and a dose amount of $1.3 \times 10^{15}$ atoms/cm$^2$. In this case, the electric conductivity of the films may be such a value that ensuring the withdrawal of a carrier from the active layer.

After completing the addition step of the impurity elements, the resist mask 209 is removed, and a furnace annealing treatment is conducted in a hydrogen atmosphere at 350° C. for 1 hour to conduct a hydrogenation step. In this example, the hydrogenation step also functions as an activation step of the impurities added in the preceding step.

While the n-type semiconductor and the p-type semiconductor are formed by the addition of impurities in this example, it is possible to add impurities endowing n-type or p-type semiconductivity in the film forming gas on the film formation of the semiconductor layers.

A resist mask (not shown in the figures) having openings is provided on a part of the gate wiring connected to the gate electrode (a part electrically connected to wiring formed later), and contact holes (not shown in the figures) are formed by etching the microcrystalline silicon film, the amorphous silicon film and the gate insulating film, respectively, by using dry etching. The dry etching can be conducted according to the conventional technique.

After the resist mask not shown in the figures is removed, a conductive film mainly comprising aluminum is formed on the n-type semiconductor layer and the p-type semiconductor layer, and source wiring 212 and 213 and drain wiring 214 are formed by patterning the conductive film. At this time, the gate wiring and the source wiring (drain wiring) are electrically connected to each other via the contact holes previously provided.

Etching of the n-type semiconductor layer and the p-type semiconductor layer is conducted by using the wiring as a mask. While the etching conditions may be the same as those in the formation of the contact holes, the conditions should be set in such a manner that the wiring is not etched but the semiconductor layers are etched.

The etching of the semiconductor layers is terminated by the spacer insulating layers 203 and 204, and the source wiring and the drain wiring are completely separated electrically from each other. After completing the steps until now, hydrogenation is conducted in a hydrogen atmosphere, to complete a CMOS circuit having the structure shown in FIG. 3E.

According to the structure of this example, a reverse stagger TFT can be produced with a number of masks (6 masks) smaller than Example 1 by one masks. Accordingly, improvement in yield and reduction in production cost can be realized. The TFT of this example has electric characteristics that are not inferior to those of the TFT produced in Example 1.

EXAMPLE 4

In this example, the case where a layer containing germanium is formed by the solution coating method (spin coating method) on the amorphous silicon film is described.

In this example, a solution containing germanium is coated on the amorphous silicon film. Examples of such a solution include aqueous solutions of germanium oxide ($GeO_x$, typically $GeO_2$), germanium chloride ($GeCl_4$), germanium bromide ($GeBr_4$), germanium sulfide ($GeS_2$) and germanium acetate ($Ge(CH_3CO_2)$).

In some cases, an alcoholic solvent, such as ethanol and isopropyl alcohol, may be used as the solvent.

The solution is formed to have a concentration of from 100 to 1,000 ppm, and a layer containing germanium is formed on the amorphous silicon film by coating and spin drying the solution. Since the amorphous silicon exhibits a hydrophobic property, it is preferred that a thin silicon oxide film formed to increase wettability before the spin coating.

After completing the spin coating, the heat treatment for crystallization is conducted as it is, to obtain a polysilicon film. Since germanium is present on the surface of the polysilicon film in a high concentration, the film is preferably washed with an etchant such as hydrofluoric acid.

Figure 3E:
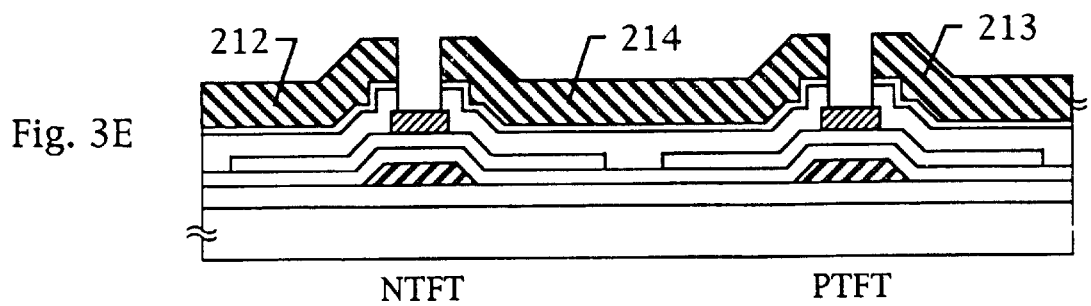

By applying the constitution of this example to Example 1 or 2, a TFT having the structure shown in FIG. 2D or FIG. 3E can be produced.

EXAMPLE 5

In the addition of germanium to the amorphous silicon film, the ion implantation method, the plasma doping method and the laser doping method can be employed.

German ($GeH_4$) may be used as an excitation gas, which is preferably controlled in such a manner that germanium is added to the amorphous silicon film to a concentration of from $1\times10^{14}$ to $5\times10^{19}$ atoms/cm$^3$ (typically from $1\times10^{16}$ to $1\times10^{18}$ atoms/cm$^3$).

The acceleration effect for crystallization of germanium added to the amorphous silicon film can be effectively utilized as far as the concentration thereof is $1\times10^{14}$ atoms/cm$^3$ or more (preferably $1\times10^{16}$ atoms/cm$^3$ or more). When the addition amount of germanium is too large, the property of the film becomes close to a germanium film, to deteriorate the characteristics of the TFT. Therefore, the concentration of germanium is preferably suppressed to $5\times10^{19}$ atoms/cm$^3$ or less, more preferably $1\times10^{18}$ atoms/cm$^3$ or less.

The amorphous silicon film, to which germanium has been added, is easily crystallized by a heat treatment at a temperature of from 450 to 650° C. The polysilicon film obtained in this example contains a large amount of bonds, in which a silicon atom is substituted with a germanium atom, and it is considered that the film becomes so called silicon germanium (represented by $Si_xGe_{1-x}$).

Because the silicon germanium film has a narrower band gap than a silicon film, it has been know that the mobility of a carrier (electron or hole) is increased. However, it should be noted that there are cases where the TFT characteristics are largely changed depending on the content of germanium.

By applying the constitution of this example to Example 1 or 2, a TFT having the structure shown in FIG. 2D or FIG. 3E can be produced.

EXAMPLE 6

In this example, a method, in which germanium is added during the film formation, is employed when the amorphous silicon film is formed on the substrate.

The film formation is conducted by the reduced pressure thermal CVD method or the plasma CVD method, and silane ($SiH_4$) or disilane ($Si_2H_6$), to which a prescribed amount of germane ($GeH_4$) has been added, are used as a film formation gas. A gas comprising disilane mixed with germanium fluoride ($GeF_4$) may also be employed.

The addition amount of germanium can be controlled by the flow amount of the germane gas in this means, germanium can be uniformly dispersed in the amorphous silicon film. Furthermore, any special step for adding germanium is not necessary, and it is effective to simplify the production steps.

In this example, the flow amount of the germane gas is controlled in such a manner that the amorphous silicon film contains germanium in a concentration of from $1\times10^{14}$ to $5\times10^{19}$ atoms/cm$^3$ (preferably from $1\times10^{16}$ to $1\times10^{18}$ atoms/cm$^3$). The explanations for the upper limit and the lower limit of the germanium concentration have been made in Example 4 and are omitted here.

The amorphous silicon film, to which germanium has been added, is easily crystallized by a heat treatment at a temperature of from 500 to 600° C. As similar to Example 4, it is considered that the resulting polysilicon film obtained by the crystallization becomes a silicon germanium film.

By applying the constitution of this example to Example 1 or 2, a TFT having the structure shown in FIG. 2D or FIG. 3E can be produced.

EXAMPLE 7

When a TFT is produced according to the constitutions of Examples 1 and 3 to 6, germanium is present in the polysilicon film (active layer). There is actually no problem when germanium is present, but gettering of germanium present in the silicon lattice in unmatched conditions is useful.

Figure 5A:
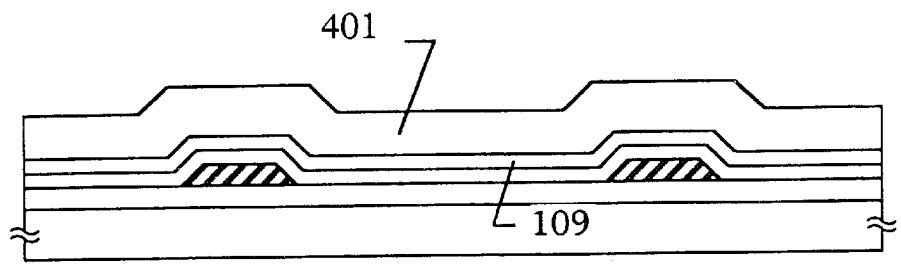
FIGS. 5A to 5C are cross sectional views showing the production process of the thin film transistor.
Figure 5B:
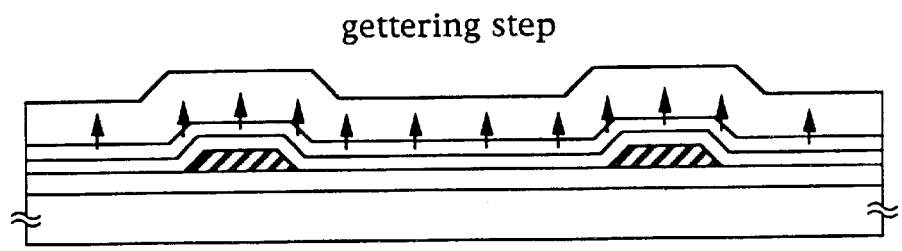
Figure 5C:
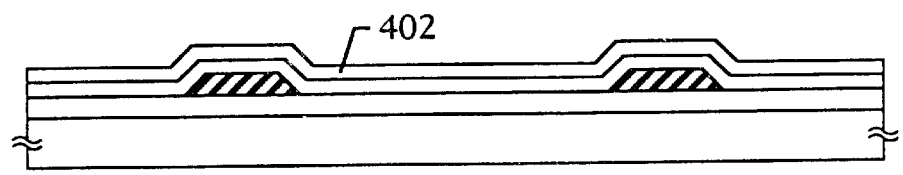

The production process of this example will be described with reference to FIGS. 5A to 5D. The steps until FIG. 1C are completed according to the steps of Example 1. A thin film 401 containing phosphorous is formed on the polysilicon film 109. (FIG. 5A)

Representative examples of the thin film containing phosphorous include an insulating film comprising silicon oxide, to which phosphorous is added, called PSG (phosphorous silicate glass). An n-type amorphous silicon film obtained by adding phosphorous to an amorphous silicon film can also be used in this example.

After forming the thin film 401 containing phosphorous, a heat treatment is conducted at a temperature of from 500 to 600° C. (typically 550° C.) for from 2 to 8 hours (typically 4 hours). (FIG. 5B) Germanium contained in the polysilicon film 109 (particularly germanium penetrating into the silicon lattice to form lattice unmatching) migrates into the thin film 401 according to the arrows by the gettering effect.

The migrating distance of germanium is as small as equivalent to the thickness of the polysilicon film 109. Therefore, effective gettering can be conducted even in the treatment at a relatively low temperature for a relatively short duration.

The thin film 401 containing phosphorous is then removed, to obtain a polysilicon film 402, from which germanium present among the lattice has been removed. Thereafter, the same procedures as in Example 1 and 3 are conducted to produce the TFT.

By employing the constitution of this example, distortion and dislocation due to lattice unmatching can be reduced to improve the mobility of the carrier. That is, the mobility of the TFT is improved.

As the gettering technique, the technique described in JP-A-10-270363 by the inventors can be utilized. A copending application Ser. No. 09/050,182 filed on Mar. 26, 1998 is a counterpart U.S. application of JP-A-10-270363. An entire disclosure of this application is incorporated herein by reference.

EXAMPLE 8

Figure 7A:
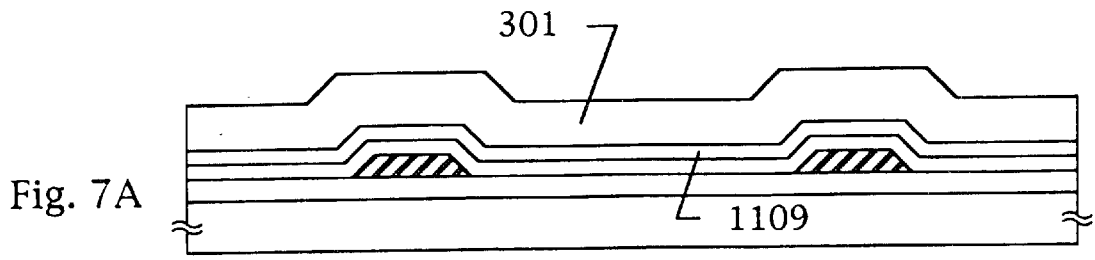
FIGS. 7A to 7C are cross sectional views showing the production process of the thin film transistor.

In this example, a case where phosphorous is used as a means for gettering germanium is described. The production process of this example is described with reference to FIGS. 7A to 7C. The steps until that shown in FIG. 4C are completed according to the process of Example 2. A thin film 301 containing phosphorous is formed on a polysilicon film 1109. (FIG. 7A)

Representative examples of the thin film containing phosphorous include an insulating film comprising silicon oxide, to which phosphorous is added, called PSG (phosphorous silicate glass). An n-type amorphous silicon film obtained by adding phosphorous to an amorphous silicon film can also be used in this example.

Figure 7B:
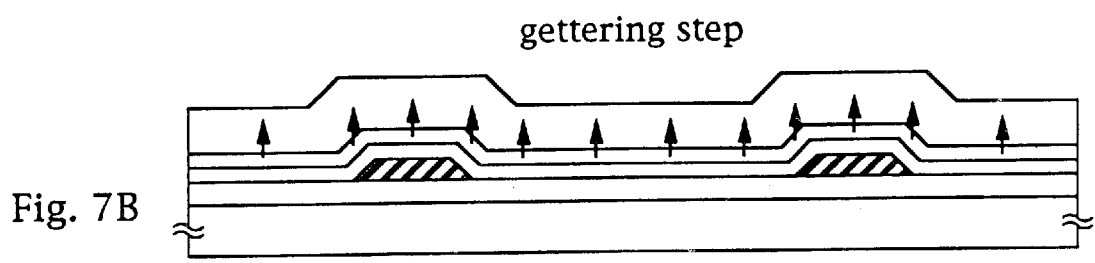
Figure 7C:
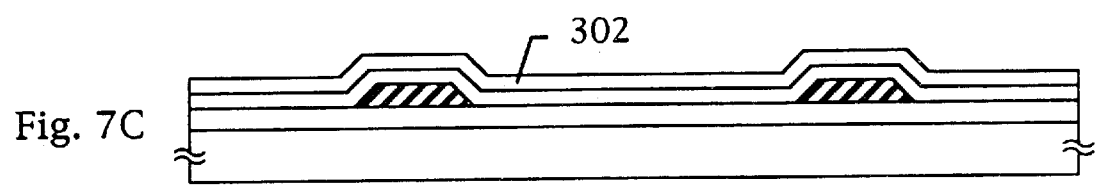

After forming the thin film 301 containing phosphorous, a heat treatment is conducted at a temperature of from 500 to 600° C. (typically 550° C.) for from 2 to 8 hours (typically 4 hours). (FIG. 7B)

Germanium contained in the polysilicon film 1109 (particularly germanium penetrating into the silicon lattice to form lattice unmatching) migrates into the thin film 301 according to the arrows by the gettering effect.

The migrating distance of germanium is as small as equivalent to the thickness of the polysilicon film 1109. Therefore, effective gettering can be conducted even in the treatment at a relatively low temperature for a relatively short duration.

The thin film 301 containing phosphorous is then removed, to obtain a polysilicon film 302, from which germanium present among the lattice has been removed. Thereafter, the same procedures as in Example 2 or 3 are conducted to produce the TFT.

As the gettering technique, the technique described in JP-A-10-270363 by the inventors can be utilized.

Furthermore, it is possible that the gettering step by phosphorous shown in this example is conducted immediately after the crystallization of the amorphous silicon film, and after the gettering step, the fixing step of the silicon interface shown in Example 2 is conducted.

EXAMPLE 9

In the case where the crystallization step using germanium as a catalyst element is conducted, the oxygen amount present in the treatment atmosphere on crystallization should be noted. As described in Examples 1 and 2, germanium is easily oxidized to become inert germanium oxide, and therefore oxygen is necessarily avoided as possible.

Accordingly, it is preferred that the steps, (1) cleaning the surface of the amorphous silicon film, (2) forming a germanium film, and (3) crystallizing by a heat treatment, are continuously performed without exposing to the air.

Figure 13A:
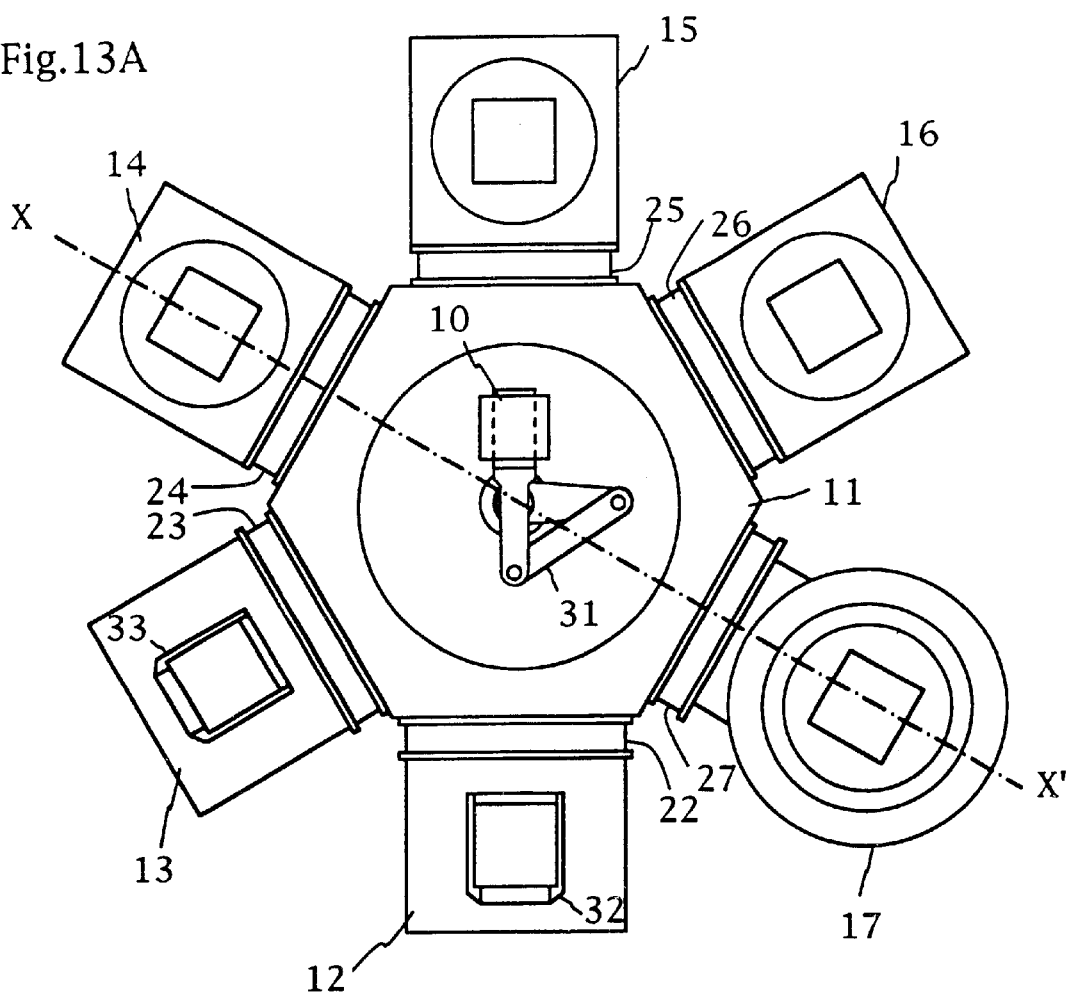
FIGS. 13A and 13B are diagrams showing the constitution of the multi chamber type treating apparatus.
Figure 13B:
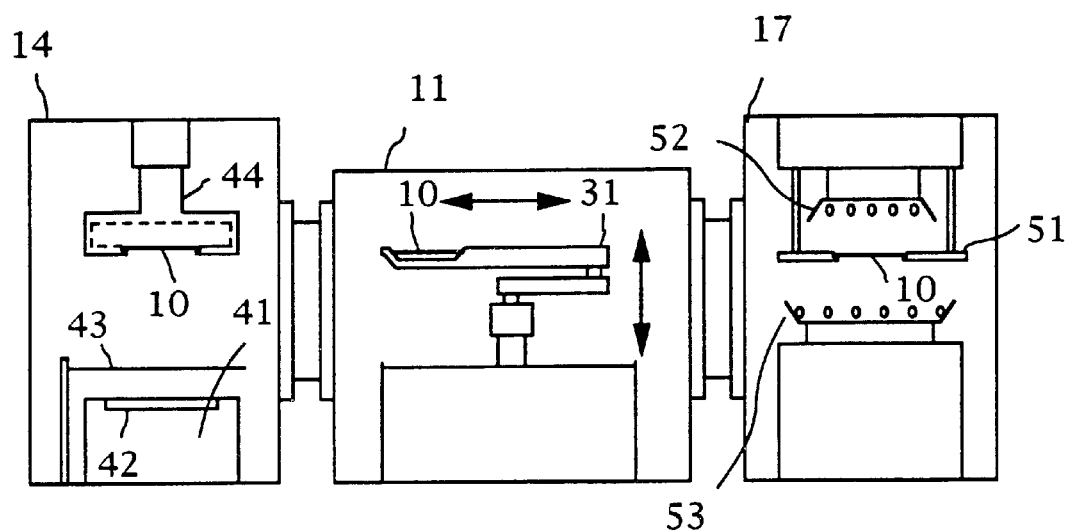

In this example, such continuous steps are conducted by using a treatment apparatus of a multichamber (cluster tool) type. The treatment apparatus used in this example is shown in FIGS. 13A and 13B. FIG. 13A is a plan view, and FIG. 13B is a cross sectional view taken on the broken line X–X' in FIG. 13A.

Numeral 11 denotes a common chamber as the whole apparatus, 12 and 13 denote load lock chambers, 14 and 15 denote sputtering chamber, 16 denotes an etching chamber, and 17 denotes a heating chamber. The chambers 12 to 17 are connected to the common chamber 11 via gate valves, to maintain gastightness for each chamber.

Exhausting systems (not shown in the figures) to make reduced pressure conditions and gas supplying systems (not shown in the figures) to supply a gas for controlling an atmosphere and a sputtering gas are provided for each of chambers 11 to 17. In the exhausting systems for the sputtering chambers 14 and 15 and the etching chamber 16, cryopumps are equipped to realize the ultimate degree of vacuum of $10^{-6}$ Pa.

In the common chamber 11, a robotic arm 31 is provided to transfer a substrate 10 to be treated to the chambers 12 to 17. A part holding the substrate of the robotic arm 31 is three dimensionally movable as shown by the arrows. The robotic arm 31 is a face down type, in which the substrate 10 to be treated is transferred with the surface, on which the device is formed, facing downward, to prevent attachment of dust such as particles on the surface, on which the device is formed.

The load lock chambers 12 and 13 are chambers for carrying the substrate 10 to be treated into the apparatus and out from the apparatus. The substrate 10 to be treated is carried into the apparatus or out from the apparatus by setting in substrate transferring cartridges 32 and 33.

The sputtering chambers 14 and 15 have substantially the same structure as each other, and the constitution of the sputtering chamber 14 is described with reference to FIG. 13B. In this example, a germanium film is formed in the sputtering chamber 14 or 15.

In the sputtering chamber 14, a target carrier 41, a target 42, a shutter 43 and a substrate holder of a face down type 44 are equipped. The substrate holder 44 is designed to holed a region of the substrate 10 to be treated several millimeters from the edge, so that contamination of the substrate 10 is minimized as possible.

A DC current is supplied to the target via the target carrier 41 from a DC power source not shown in the figures. The specifications of the gas supplying system are determined depending on the species of the material of films formed in the sputtering chambers 14 and 15.

While the etching chamber 16 in this example has substantially the same structure as the sputtering chambers 14 and 15, an RF power source is connected instead of the DC power source, and RF power is supplied to the substrate 10, to apply a negative self bias voltage.

In this example, the surface of the amorphous silicon film is subjected to surface cleaning by lightly sputtering with a rare gas (such as argon and helium) in the etching chamber 16 (which means that the surface layer is etched), so that the surface of the amorphous silicon film is cleaned.

The heating chamber 17 is a chamber for the crystallization step and has a constitution in that an RTA treatment can be performed as a heating means from the standpoint of throughput. A substrate holder 51 and heating lamps 52 and 53 emitting infrared rays to heat the substrate 10 from the both sides thereof are equipped. The heating lamp 53 is the main lamp for heating the primary surface of the substrate.

The method for using the treating apparatus shown in FIGS. 13A and 13B is described below. A substrate 10 to be treated (a substrate having an amorphous silicon film formed thereon) is carried into the sputtering apparatus through the load lock chamber 12. The load lock chamber 12 is made vacuum and then in a nitrogen atmosphere. The common chamber 11, sputtering chambers 14 and 15, and the etching chamber 16 are made vacuum to the ultimate pressure of $10^{-6}$ Pa.

A gate valve 22 is opened, the substrate 10 is transferred to the etching chamber 16 by the robotic arm 31. (In the figure, the reference numerals 22 through 27 designate gate valves.) In order to prevent mixing of the atmospheres, the two gate valves 22 and 27 are controlled in such a manner that both of them are not opened at the same time. Such control of the valves is the same as in the following. The substrate is fixed by a substrate holder in the etching chamber 16, a sputtering step is conducted by using an argon gas with applying an RF power to the substrate. Impurities and a spontaneous oxidized film on the surface of the amorphous silicon film are removed by the sputtering step.

The substrate 10 is transferred to the sputtering chamber 14 to form a germanium film. The substrate 10 is then transferred to the heating chamber 17. The heating chamber 17 has a nitrogen atmosphere, and the amorphous silicon film is crystallized by heating the substrate 10 by the heating lamps 52 and 53. After completing the crystallization step, the substrate is transferred to the cartridge 33 in the load lock chamber 13, to carry out from the sputtering apparatus.

In order to suppress the oxidation of the germanium film before the crystallization step as possible, it is effective that an insulating film, such as a silicon nitride film and a silicon oxide nitride film, is formed in the sputtering chamber 15 after the formation of the germanium film in the sputtering chamber 14, to cover the surface of the germanium.

The constitution, in which the crystallization step is conducted in such a manner that the germanium film is not exposed to the treating atmosphere by covering with the insulating film, is an effective technique not only for the treating apparatus of a multichamber type as in this example, but also particularly for the case where the crystallization step is necessarily conducted in an outer electric heating furnace. It is easy to combine this constitution with the constitutions shown in Examples 1 to 8.

EXAMPLE 10

In this example, an example, in which plural TFTs are formed on a glass substrate by using the invention, to produce an active matrix type liquid crystal display device comprising a driver circuit and a pixel matrix circuit uniformly formed, is described with reference to FIG. 6.

The structure of this example can be realized by adding some additional steps to the process of Example 1. The state of FIG. 2D is obtained according to the steps of Example 1. At this time, NTFTs arranged in a matrix form are produced in the region to be the pixel matrix circuit.

Figure 6:
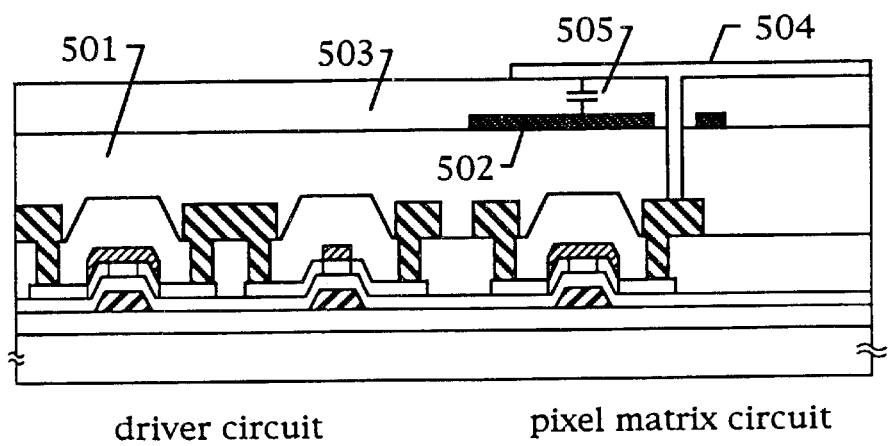
FIG. 6 is a cross sectional view showing the constitution of the active matrix type liquid crystal display device.

A polyimide film having a thickness of 1 $\mu$m is formed thereon as the first flattening film 501 as shown in FIG. 6. Other organic resin materials than polyimide, such as acryl, may be used. A black mask 502 comprising a conductive film such as titanium is then formed.

A polyimide film having a thickness of 500 nm is formed as the second flattening film 503. After forming the second flattening film 503, contact holes are formed, and a pixel electrode 504 comprising a transparent conductive film (typically an ITO film) is formed.

At this time, an auxiliary (storage) capacitance 505 is formed between the black mask 502 and the pixel electrode 504 with the second flattening film 503 as a dielectric material.

The structure shown in FIG. 6 is thus completed through the steps described above. An actual active matrix type liquid crystal display device is completed by forming an oriented film after the formation of the pixel electrode, and a liquid crystal is carried between the device and a counter electrode. The cell fabrication step can be conducted according to the conventional technique, thus the explanation thereof is omitted here.

Figure 9:
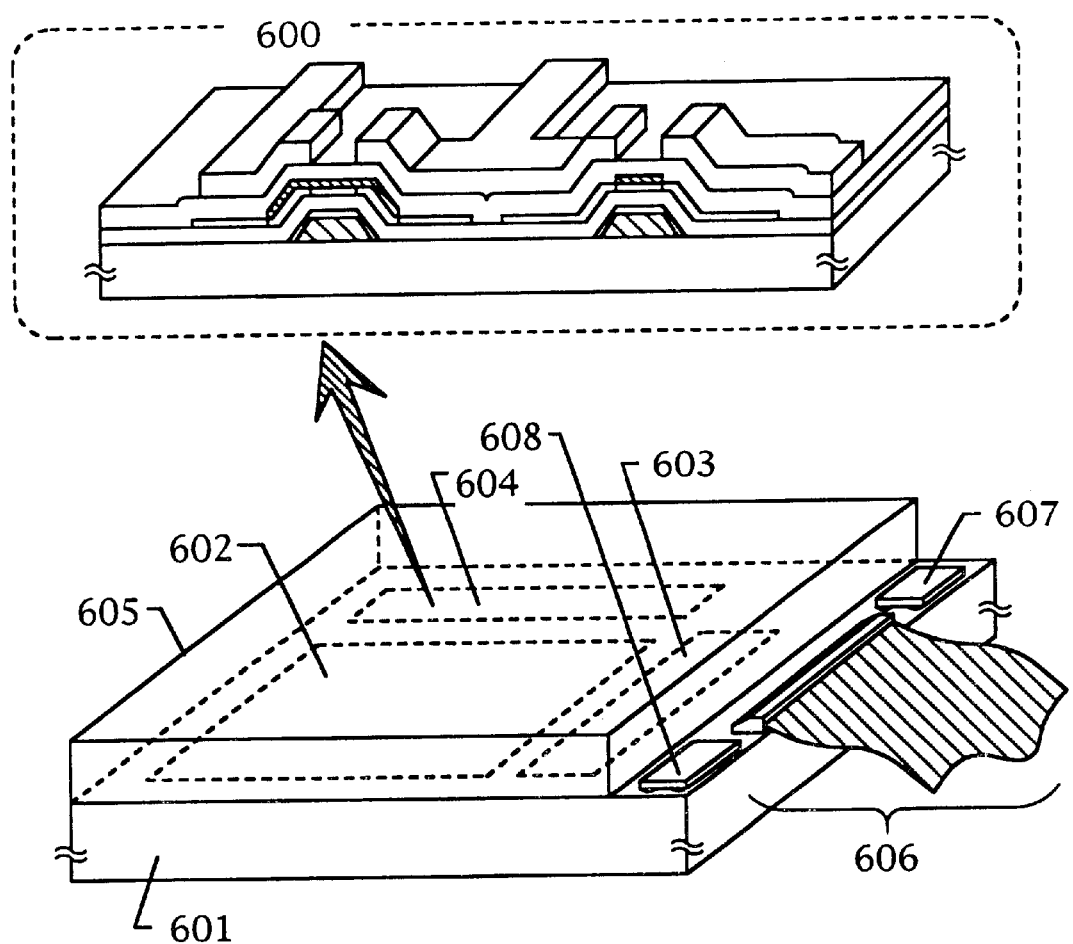
FIG. 9 is a cross sectional view showing the constitution of the active matrix type liquid crystal display device.

An appearance of the active matrix type liquid crystal display device is schematically shown in FIG. 9. In FIG. 9, numeral 601 denotes a substrate having an insulating surface, 602 denotes a pixel matrix circuit, 603 denotes a source driver circuit, 604 denotes a gate driver circuit, 605 denotes a counter electrode, 606 denotes an FPC (flexible printed circuit), and 607 and 608 denote IC chips externally mounted.

The source driver circuit 603 and the gate driver circuit 604, for example, are constituted with a CMOS circuit as shown by 600.

In this example, a reflection type liquid crystal display device can be easily produced by using a material having a high reflection property as the pixel electrode.

As described in the foregoing, an electro-optical apparatus having circuits on a substrate can be realized by forming various circuits using TFTs produced utilizing the invention. While the liquid crystal display device is exemplified in this example, an EL (electro luminescence) display device and an image sensor can also be produced.

EXAMPLE 11

In this example, an example, in which plural TFTs are formed on a glass substrate by using the invention, to produce an active matrix type liquid crystal display device comprising a driver circuit and a pixel matrix circuit on the same substrate, is described with reference to FIG. 8.

The structure of this example can be easily realized by adding some additional steps to the process of Example 2. The state of FIG. 2D is obtained according to the steps of Example 2. At this time, NTFTs arranged in a matrix form are produced in the region to be the pixel matrix circuit.

A laminated film comprising a silicon nitride film having a thickness of 50 nm, a silicon oxide film having a thickness of 25 nm, and a polyimide film having a thickness of 1 $\mu$m is formed thereon as the first flattening film 701. Other organic resin materials than polyimide, such as acryl, may be used instead of the polyimide.

An opening is formed on a drain electrode 702 of a TFT constituting the pixel matrix circuit. The opening is formed by etching the polyimide film and the silicon oxide film in this order with the silicon nitride film as the lowermost layer remaining. After forming the opening, a black mask 703 comprising a conductive film such as titanium is formed.

A polyimide film having a thickness of 500 nm is formed as the second flattening film 704. After forming the second flattening film 704, contact holes are formed in the first and second flattening films, and a pixel electrode 705 comprising a transparent conductive film (typically an ITO film) is formed.

At this time, an auxiliary capacitance is formed between the drain electrode 702 and the black mask 703 with the silicon nitride film having a thickness of 50 nm as a dielectric material. In the structure of this example, the auxiliary capacitance is formed on the TFT, and thus the opening ratio is not deteriorated.

Figure 8:
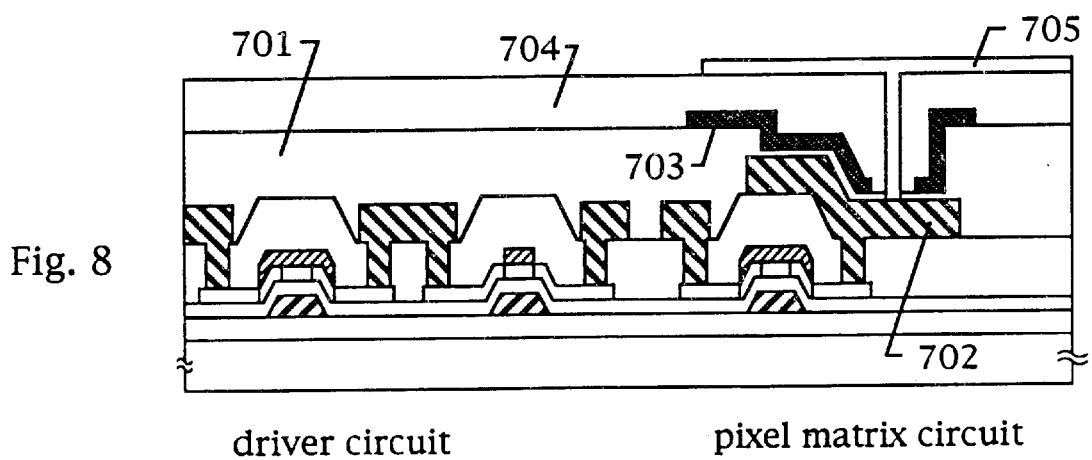
FIG. 8 is a cross sectional view showing the constitution of the active matrix type liquid crystal display device.

The structure shown in FIG. 8 is thus completed through the steps described above. An actual active matrix type liquid crystal display device is completed by forming an oriented film after the formation of the pixel electrode, and a liquid crystal is carried between the device and a counter electrode. The cell fabrication step can be conducted according to the conventional technique, thus the explanation thereof is omitted here.

An appearance of the active matrix type liquid crystal display device is schematically shown in FIG. 9. In FIG. 9, numeral 601 denotes a substrate having an insulating surface, 602 denotes a pixel matrix circuit, 603 denotes a source driver circuit, 604 denotes a gate driver circuit, 605 denotes a counter electrode, 606 denotes an FPC (flexible printed circuit), and 607 and 608 denote IC chips externally mounted.

The source driver circuit 603 and the gate driver circuit 604, for example, are constituted with a CMOS circuit as shown by 600.

In this example, a reflection type liquid crystal display device can be easily produced by using a material having a high reflection property as the pixel electrode.

As described in the foregoing, an electro-optical apparatus having circuits on a substrate can be realized by forming various circuits using TFTs produced utilizing the invention. While the liquid crystal display device is exemplified in this example, an EL (electro luminescence) display device and an image sensor can also be produced.

EXAMPLE 12

The electro-optical devices shown in the previous Examples such as Ex. 1 and 2 can be utilized as a display device of various kinds of electronic apparatus. Examples of the electronic apparatus include a camcorder, a still camera, a projection display, a projection television, a head-mounting display, a car navigation system, a personal computer, and a portable information terminal (such as a portable computer and a cellular phone). Examples thereof are shown in FIGS. 10A to 10F.

Figure 10A:
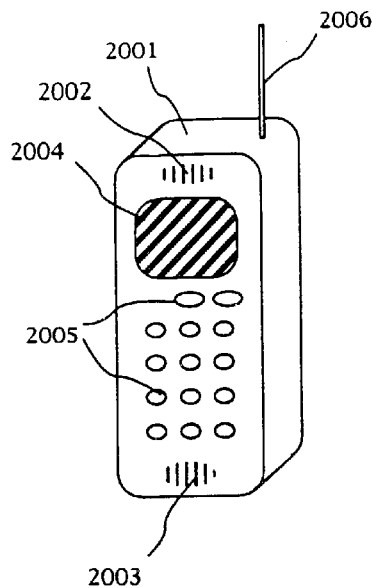
FIGS. 10A to 10F are schematic perspective views showing electronic apparatuses.

FIG. 10A shows a cellular phone, which comprises a main body 2001, a voice input part 2002, a voice output part 2003, a display device 2004, operation switches 2005 and an antenna 2006. The invention can be applied to the display device 2004, for example.

Figure 10B:
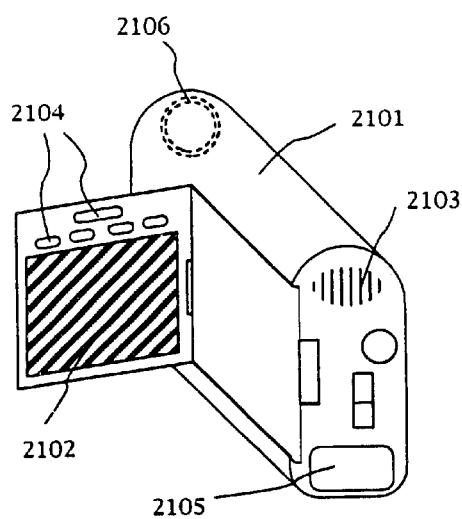

FIG. 10B shows a camcorder, which comprises a main body 2101, a display device 2102, a voice input part 2103, operation switches 2104, a battery 2105 and an image receiving part 2106. The invention can be applied to the display device 2102.

Figure 10C:
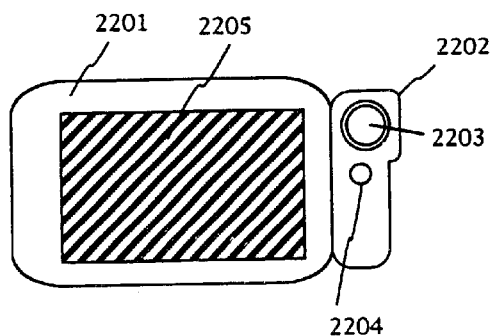

FIG. 10C shows a portable computer, which comprises a main body 2201, a camera part 2202, an image receiving part 2203, a operation switch 2204 and a display device 2205. The invention can be applied to the display device 2205, for example.

Figure 10D:
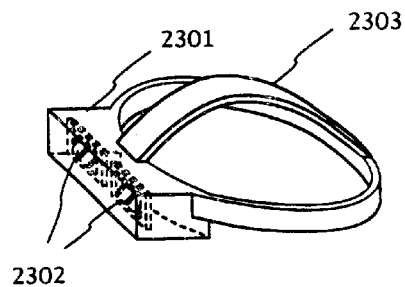

FIG. 10D shows a head-mounting display, which comprises a main body 2301, a display device 2302 and a band part 2303. The invention can be applied to the display device 2302.

Figure 10E:
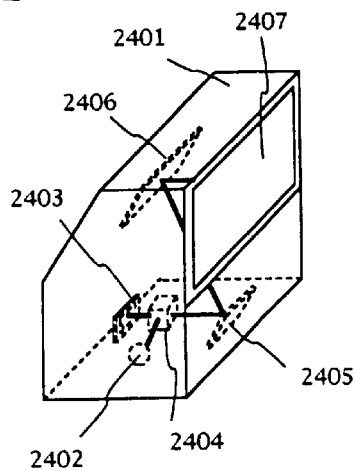

FIG. 10E shows a rear type projection display, which comprises a main body 2401, a light source 2402, a display device 2403, a polarizing beam splitter 2404, reflectors 2405 and 2406 and a screen 2407. The invention can be applied to the display device 2403.

Figure 10F:
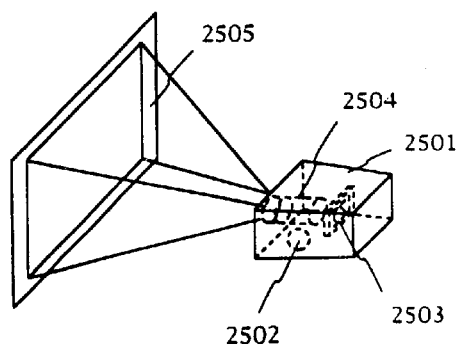

FIG. 10F shows a front type projection display, which comprises a main body 2501, a light source 2502, a display device 2503, an optical system 2504 and a screen 2505. The invention can be applied to the display device 2503.

As described foregoing, the application range of the invention is extremely wide, and the invention can be applied to any electronic apparatus of any field. In particular, it can be said that the invention is extremely effective in an electronic apparatus, in which the portability is important.

By utilizing the invention, a semiconductor thin film having a high crystallinity can be produced with a production process having a high mass productivity. Accordingly, a semiconductor device having a high performance TFT using such a semiconductor thin film as an active layer can be realized.

What is claimed is:

1. A semiconductor device comprising a circuit comprising plural TFTs formed on a substrate having an insulating surface, wherein a channel forming region of said plural TFT comprises a crystalline semiconductor film having a main orientation plane of a {111} plane, and germanium is present in a higher concentration with closer to a vicinity of a primary surface of said crystalline semiconductor film.

2. A semiconductor device comprising a circuit comprising plural TFTs formed on a substrate having an insulating surface, wherein a channel forming region of said plural TFT comprises a crystalline semiconductor film having a main orientation plane of a {111} plane, which is substantially regarded as a single crystal, and germanium is present in a higher concentration with closer to a vicinity of a primary surface of said crystalline semiconductor film.

3. A semiconductor device according to claim 2, wherein said germanium is present only in said vicinity of said primary surface of said crystalline semiconductor film.

4. A semiconductor device according to claim 2, wherein said germanium is present in a concentration of from $1 \times 10^{14}$ to $1 \times 10^{22}$ atoms/cm$^3$.

5. A semiconductor device according to claim 2 wherein said TFT is a bottom gate type TFT.

6. A semiconductor device comprising a circuit comprising plural TFTs formed on a substrate having an insulating surface, wherein a channel forming region of said plural TFT comprises a crystalline semiconductor film having a main orientation plane of a {111} plane, and germanium is present in said crystalline semiconductor film in a concentration of from $1 \times 10^{14}$ to $1 \times 10^{20}$ atoms/cm$^3$, and said crystalline semiconductor film has a spin density of $5 \times 10^{17}$ spins/cm$^3$ or less.

7. A semiconductor device comprising a circuit comprising plural TFTs formed on a substrate having an insulating surface, wherein a channel forming region of said plural TFT comprises a crystalline semiconductor film having a main orientation plane of a {111} plane, which is substantially regarded as a single crystal, and germanium is present in said crystalline semiconductor film in a concentration of from $1 \times 10^{14}$ to $1 \times 10^{20}$ atoms/cm$^3$, and said crystalline semiconductor film has a spin density of $5 \times 10^{17}$ spins/cm$^3$ or less.

8. A semiconductor device according to claim 1, wherein said germanium is present only in said vicinity of said primary surface of said crystalline semiconductor film.

9. A semiconductor device according to claim 1, wherein said germanium is present in a concentration of from $1 \times 10^{14}$ to $1 \times 10^{22}$ atoms/cm$^3$.

10. A semiconductor device according to claim 1 wherein said TFT is a bottom gate type TFT.

11. A semiconductor device having at least one active matrix type display panel, said panel comprising:

a substrate having an insulating surface;

a plurality of pixel electrodes arranged in a matrix form formed over said substrate, each of said pixel electrodes being electrically connected to at least one first thin film transistor, wherein said first thin film transistor comprising a channel forming layer comprising crystal silicon, a gate insulating layer adjacent to the channel forming layer and a gate electrode adjacent to said gate insulating layer;

a driving circuit comprising at least one second thin film transistor for driving said first thin film transistor, wherein said second thin film transistor comprising a channel forming layer comprising crystal silicon, a gate insulating layer adjacent to the channel forming layer and a gate electrode adjacent to said gate insulating layer, wherein the channel forming layer of each of said first and second thin film transistors has a {111} orientation and contains germanium, and a concentration of said germanium is higher in an upper portion of said channel forming layer than a lower portion thereof.

12. A semiconductor device having at least one active matrix type display panel, said panel comprising:

a substrate having an insulating surface;

a plurality of pixel electrodes arranged in a matrix form formed over said substrate, each of said pixel electrodes being electrically connected to at least one first thin film transistor, wherein said first thin film transistor comprising a channel forming layer comprising crystal silicon, a gate insulating layer adjacent to the channel forming layer and a gate electrode adjacent to said gate insulating layer;

a driving circuit comprising at least one second thin film transistor for driving said first thin film transistor, wherein said second thin film transistor comprising a channel forming layer comprising crystal silicon, a gate insulating layer adjacent to the channel forming layer and a gate electrode adjacent to said gate insulating layer, wherein the channel forming layer of each of said first and second thin film transistors contains germanium at a concentration not higher than $1 \times 10^{20}$ atoms/cm$^3$ and has a spin density not higher than $5 \times 10^{17}$ spins/cm$^3$.

13. A semiconductor device according to claim 11 wherein said active matrix type display panel is a liquid crystal device.

14. A semiconductor device according to claim 11 or 12 wherein said active matrix type display panel is an electroluminescence device.

15. A semiconductor device according to claim 11 further comprising a main body, a voice input part, operation switches, a battery, and an image receiving part, each of which is operationally connected to said active matrix type display panel, to constitute a camcorder.

16. A semiconductor device according to claim 11 further comprising a main body, a camera part, an operation switch, each of which is operationally connected to said active matrix type display panel, to constitute a portable computer.

17. A semiconductor device according to claim 11 further comprising a main body, and a band part, operationally connected to said active matrix type display panel, to constitute a head-mounting display.

18. A semiconductor device according to claim 11 further comprising a main body, a light source, 2402, a polarizing beam splitter, reflectors, a screen, each operationally connected to said active matrix type display panel, to constitute a projection type display.

19. A semiconductor device according to claim 12, wherein said active matrix type display panel is a liquid crystal device.

20. A semiconductor device according to claim 12, wherein said active matrix type display panel is an electroluminescence device.

21. A semiconductor device according to claim 12, further comprising a main body, a voice input part, operation switches, a battery, and an image receiving part, each of which is operationally connected to said active matrix type display panel, to constitute a camcorder.

22. A semiconductor device according to claim 12, further comprising a main body, a camera part, an operation switch, each of which is operationally connected to said active matrix type display panel, to constitute a portable computer.

23. A semiconductor device according to claim 12, further comprising a main body, and a band part, operationally connected to said active matrix type display panel, to constitute a head-mounting display.

24. A semiconductor device according to claim 12, further comprising a main body, a light source, 2402, a polarizing beam splitter, reflectors, a screen, each operationally connected to said active matrix type display panel, to constitute a projection type display.

* * * * *